United States Patent
Nakamura et al.

(10) Patent No.: US 8,367,308 B2
(45) Date of Patent: Feb. 5, 2013

(54) SUBSTRATE PROCESSING METHOD

(75) Inventors: Hiroshi Nakamura, Kumamoto (JP); Takafumi Niwa, Kumamoto (JP); Yuhei Kuwahara, Yamanashi (JP); Tadatoshi Tomita, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 13/023,670

(22) Filed: Feb. 9, 2011

(65) Prior Publication Data

US 2011/0200949 A1 Aug. 18, 2011

(30) Foreign Application Priority Data

Feb. 12, 2010 (JP) ................................. 2010-029339
Nov. 30, 2010 (JP) ................................. 2010-266897

(51) Int. Cl.
*G03F 7/26* (2006.01)
(52) U.S. Cl. ............... 430/322; 430/394; 430/30; 134/1
(58) Field of Classification Search .................... 430/30, 430/325, 331, 322, 394; 134/1
See application file for complete search history.

(56) References Cited

U.S. PATENT DOCUMENTS

2009/0280440 A1* 11/2009 Tarutani et al. ............... 430/325

FOREIGN PATENT DOCUMENTS

JP 07-147219 A 6/1995

* cited by examiner

*Primary Examiner* — Kathleen Duda
*Assistant Examiner* — Caleen Sullivan
(74) *Attorney, Agent, or Firm* — Pearne & Gordon LLP

(57) ABSTRACT

A substrate processing method includes a first process (step S12 to step S16) of forming a first resist pattern by exposing a substrate having thereon a first resist film to lights, developing the exposed substrate and cleaning the developed substrate; and a second process (step S17 to step S20) of forming a second resist pattern by forming a second resist film on the substrate having thereon the first resist pattern, exposing the substrate having thereon the second resist film to lights, and developing the exposed substrate. A first processing condition is determined based on first data showing a relationship between a first processing condition under which a cleaning process is performed on the substrate in the first process (step S16) and a line width of the second resist pattern, and the first process (step S16) is performed on the substrate under the determined first processing condition.

18 Claims, 30 Drawing Sheets

SUBSTRATE PROCESSING METHOD

CROSS-REFERENCE TO RELATED APPLICATION

This application claims the benefit of Japanese Patent Application Nos. 2010-029339 and 2010-266897 filed on Feb. 12, 2010 and Nov. 30, 2010, respectively, the entire disclosures of which are incorporated herein by reference.

FIELD OF THE INVENTION

The present disclosure relates to a substrate processing method for processing a substrate.

BACKGROUND OF THE INVENTION

In manufacturing a semiconductor device, there has been used photolithography as a patterning technique for forming a circuit pattern on a semiconductor wafer (hereinafter, simply referred to as "wafer") as a processing target substrate. In order to form the circuit pattern by using photolithography, a resist film is formed on a wafer by coating the wafer with a resist solution, the resist film is exposed to lights irradiated onto the resist film so as to correspond to the circuit pattern, and then the exposed resist film is developed.

Recently, as a semiconductor device is operated at high speed and tends to be highly integrated, a circuit pattern formed on a wafer is required to be miniaturized by a patterning technique using photolithography. For this reason, conventionally, light of a shorter wavelength has been used for an exposure process, but it is not sufficient for an ultra-miniaturized semiconductor device after 45 nm node.

Here, as a patterning technique used for the ultra-miniaturized semiconductor device after 45 nm node, it has been proposed that when a pattern is formed on a single layer, patterning using photolithography is performed a plurality of times (see, for example, Patent Document 1). For example, double patterning is a technique of performing patterning process two times.

One of double patterning techniques is a lithography lithography etching (LLE) process. In the LLE process, a first resist pattern is formed by performing a first patterning process and a second resist pattern is formed by performing a second pattering process, and an etching process is performed by using the first and second resist patterns as masks.

Patent Document 1: Japanese Patent Laid-open Publication No. H07-147219

However, if resist patterns are formed by performing double patterning such as the above-described LLE process, there is a following problem.

In the first patterning process, a first resist film is formed on a wafer and then exposed and developed, so that the first resist pattern is formed. Thereafter, in the second patterning process, a second resist film is formed on the wafer, on which the first resist film is formed, and then exposed and developed, so that the second resist pattern is formed.

Here, after the development process of the first patterning process, a cleaning process is performed. However, if the cleaning process is not performed sufficiently, there may occur a development failure in the development process of the second patterning process, which may result in non-uniformity in line widths of the second resist pattern. Particularly, the line widths of the second resist pattern are not uniform between a central area of the wafer and a periphery area of the wafer.

By way of example, in order to sufficiently perform the cleaning process, it is desirable that a sufficiently long time be spent on the cleaning process. However, the sufficiently long time for the cleaning process may increase a time for processing a single sheet of a wafer, i.e., a so-called "tact time", and, thus, the number of processed wafers per unit time may decrease and productivity may be lowered.

BRIEF SUMMARY OF THE INVENTION

In view of the foregoing, the present disclosure provides a substrate processing method capable of reducing non-uniformity in line widths of a second resist pattern on a wafer surface without lowering productivity when resist patterns are formed by performing double patterning such as a LLE process.

In order to solve the above-described problem, the present disclosure provides a method as explained below.

In accordance with an embodiment of the present disclosure, there is provided a substrate processing method for processing a substrate. The substrate processing method includes a first process of forming a first resist pattern by exposing the substrate having thereon a first resist film to lights, developing the exposed substrate and cleaning the developed substrate; and a second process of forming a second resist pattern by forming a second on the substrate having thereon the first resist pattern, exposing the substrate having thereon the second resist film to lights, and developing the exposed substrate. Here, a first processing condition may be determined based on first data showing a relationship between a first processing condition under which a cleaning process is performed on the substrate in the first process and a line width of the second resist pattern. Further, the first process may be performed on the substrate under the determined first processing condition.

In accordance with the present disclosure, when resist patterns are formed by performing double patterning such as a LLE process, it is possible to reduce non-uniformity in line widths of a second resist pattern on a wafer without lowering productivity.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, embodiments of the present disclosure will be described with reference to the accompanying drawings.

First Embodiment

Above all, a substrate processing method and a substrate processing system employing the substrate processing method in accordance with a first embodiment will be explained with reference to FIGS. 1 to 14.

Figure 1:
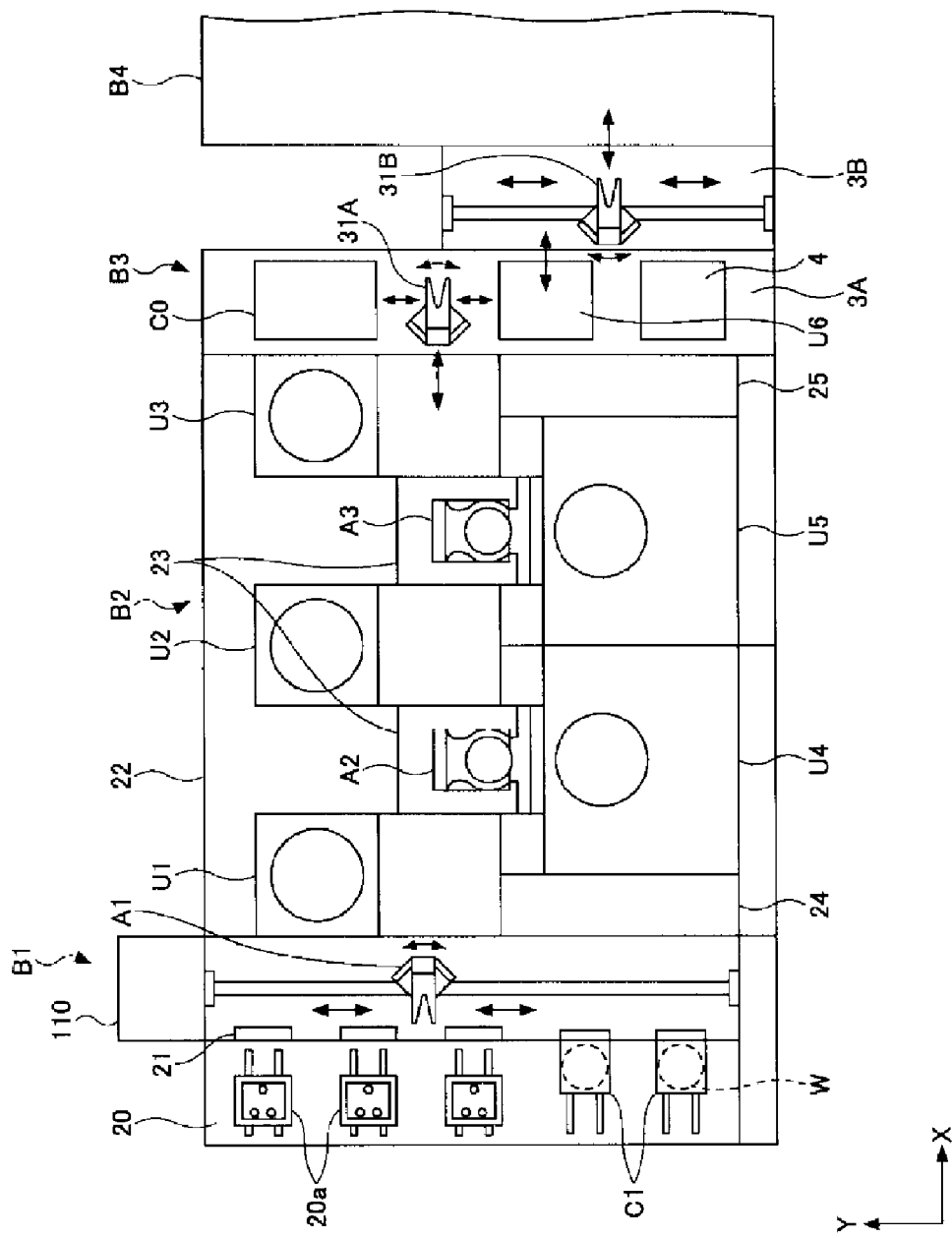
FIG. 1 is a plane view showing a schematic configuration of a substrate processing system in accordance with a first embodiment.
Figure 2:
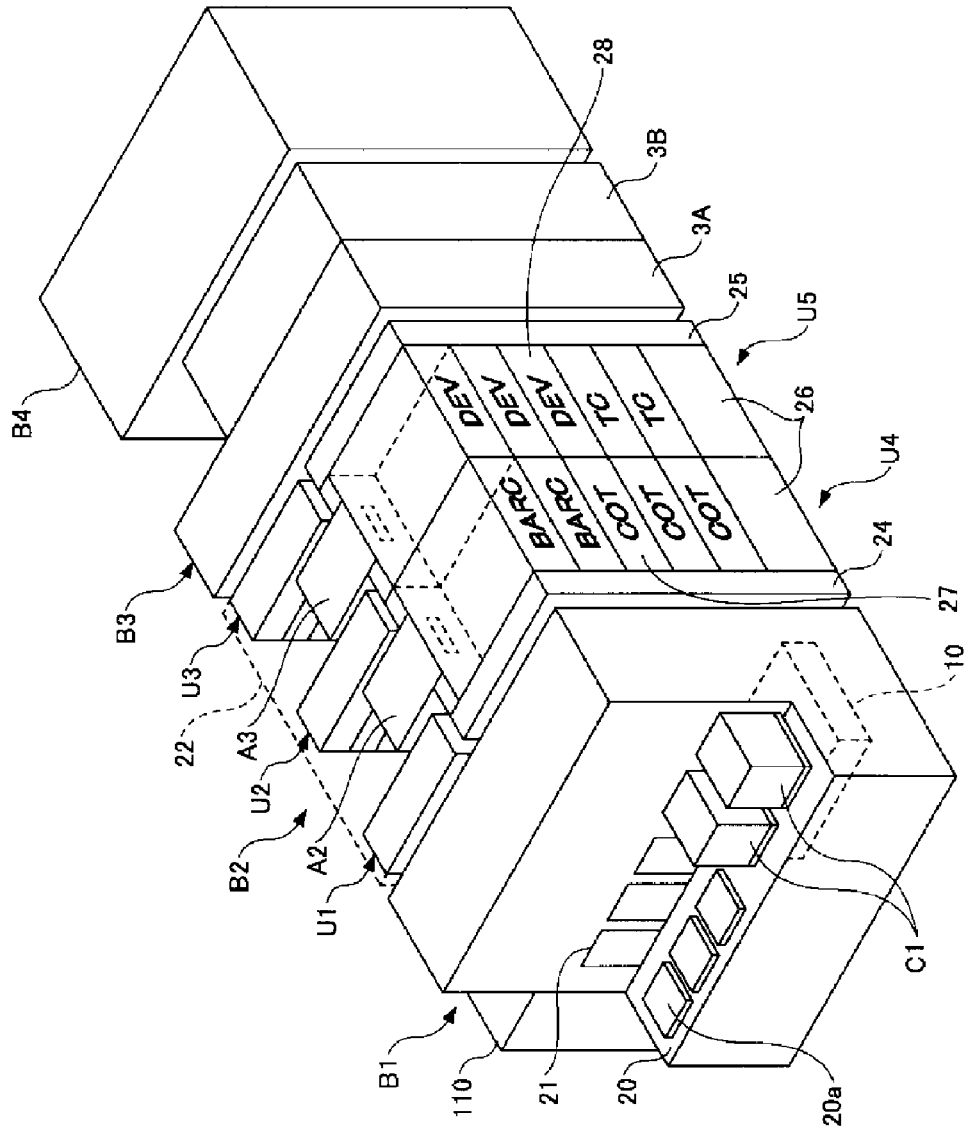
FIG. 2 is a perspective view showing a schematic configuration of the substrate processing system in accordance with the first embodiment.

Referring to FIGS. 1 and 2, a substrate processing system in accordance with the present embodiment will be explained. In this substrate processing system, a coating/developing apparatus is connected with an exposure apparatus.

FIG. 1 is a plane view showing a schematic configuration of a substrate processing system in accordance with the present embodiment, and FIG. 2 is a perspective view showing a schematic configuration of the substrate processing system in accordance with the present embodiment.

The substrate processing system includes a carrier mounting unit B1, a processing unit B2, an interface unit B3, and an exposure unit B4.

The carrier mounting unit B1 includes a carrier station 20, an opening/closing unit, and a transit mechanism A1. The carrier station 20 includes a mounting unit 20a that loads and unloads a carrier C1 in which, for example, sheets of wafers W are airtightly accommodated. The opening/closing unit 21 is provided on a wall surface on the front side of the carrier station 20. The transit mechanism A1 takes out the wafers W from the carrier C1 via the opening/closing unit 21.

Further, as depicted in FIG. 2, provided at a lower part of the carrier mounting unit B1 is a main controller 10 that controls the entire substrate processing system. Furthermore, as depicted in FIGS. 1 and 2, provided in the carrier mounting unit B1 is a line width measurement apparatus 110 that measures a line width of a resist pattern on the wafer W. The main controller 10 and the line width measurement apparatus 110 will be described in detail later.

The processing unit B2 surrounded by a housing 22 is connected with an inner side of the carrier mounting unit B1. The processing unit B2 includes rack units U1, U2, and U3; liquid processing units U4 and U5; and main transfer mechanisms A2 and A3. The rack units U1, U2, and U3 and the main transfer mechanisms A2 and A3 are alternately arranged in sequence when viewed from the carrier mounting unit B1.

The rack units U1, U2, and U3 are heating/cooling units stacked in multiple levels. The rack units U1, U2, and U3 includes various units, stacked in multiple levels, e.g., ten levels, for performing a pre-treatment and a post-treatment of a process performed by the liquid processing units U4 and U5. These various units include a heating unit for heating (baking) the wafer W and a cooling unit for cooling the wafer W.

The main transfer mechanisms A2 and A3 are installed in a space surrounded by partition walls 23. The main transfer mechanism A2 delivers the wafer W between the rack units U1 and U2 and the liquid processing unit U4. The main transfer mechanism A3 delivers the wafer W between the rack units U2 and U3 and the liquid processing unit U5.

Further, provided in the processing unit B2 are temperature/humidity control units 24 and 25 including a temperature control device for a processing solution used in each unit or a duct for controlling temperature and humidity.

As depicted in FIG. 2, the liquid processing units U4 and U5 includes coating units (COT) 27, developing units (DEV) 28, antireflection film forming units BARC, topcoat film forming units TC staked in multiple levels, e.g., five levels on liquid chemical accommodation units 26 for accommodating, for example, a resist solution or a developing solution.

The interface unit B3 includes a first transfer chamber 3A and a second transfer chamber 3B. The first transfer chamber 3A and the second transfer chamber 3B are arranged back and forth between the processing unit B2 and the exposure unit B4. Provided in the first transfer chamber 3A and the second transfer chamber 3B are a first substrate transfer unit 31A and a second substrate transfer unit 31B, respectively. Provided in the first transfer chamber 3A are a rack unit U6, a buffer cassette C0, and a substrate cleaning apparatus 4. The rack unit U6 includes a heating unit PEB for performing a baking process (PEB process) on an exposed wafer W after an exposure process and a high-precision temperature control unit including a cooling plate, that are vertically arranged.

Further, the exposure unit B4 is connected with an inner side of the rack unit U3 of the processing unit B2 via the interface unit B3.

Figure 3:
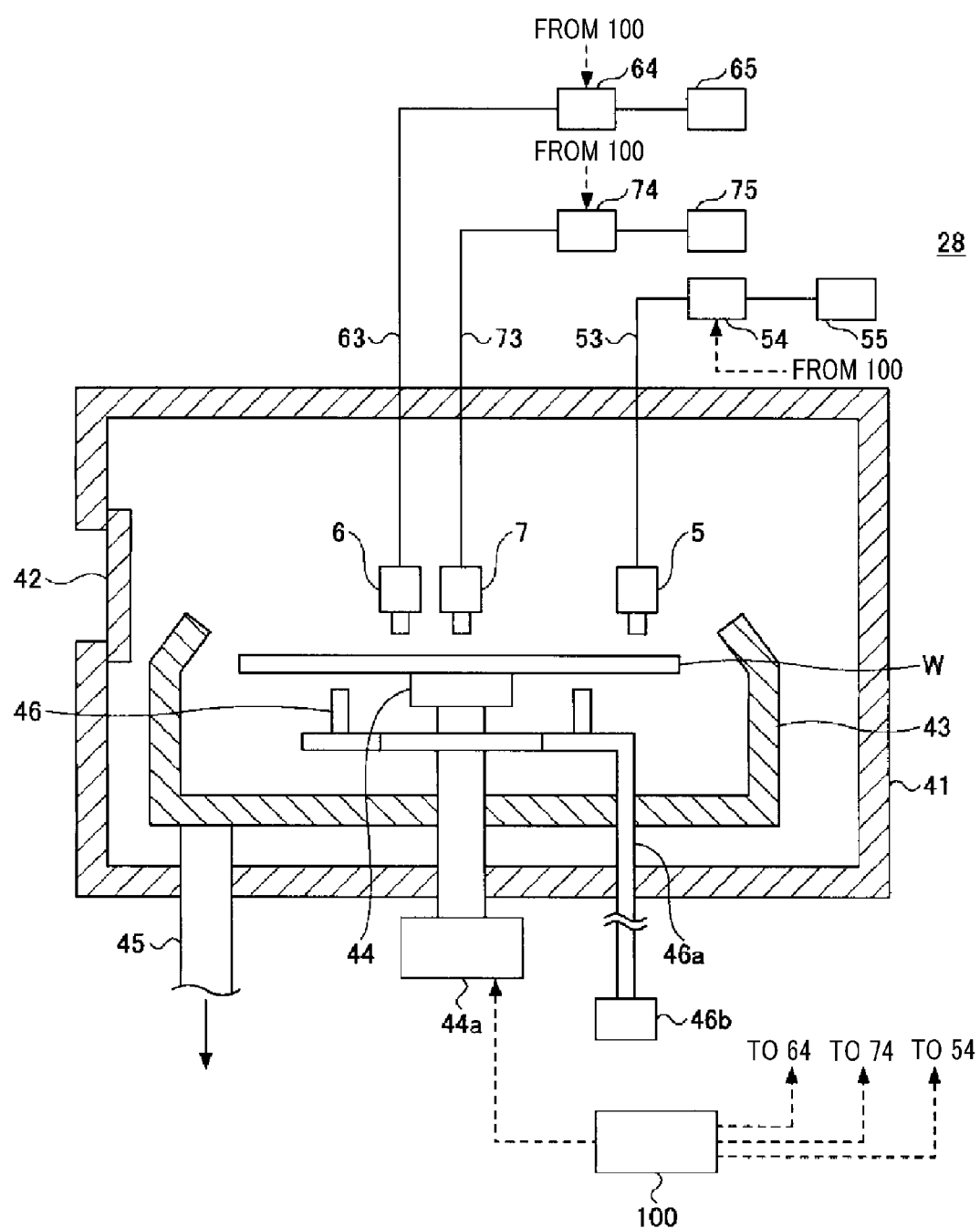
FIG. 3 is a longitudinal cross sectional view of a developing unit.
Figure 4:
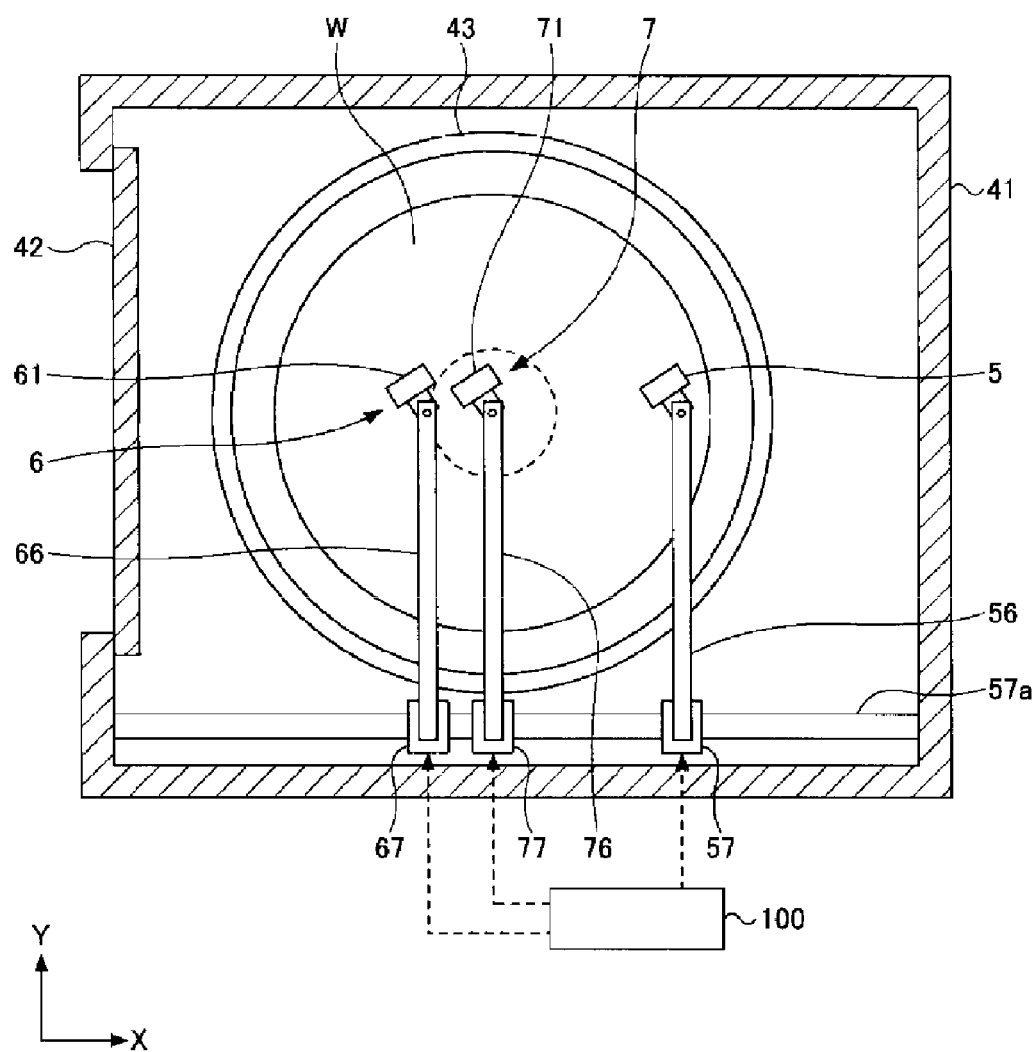
FIG. 4 is a schematic plane view of the developing unit.
Figure 5A:
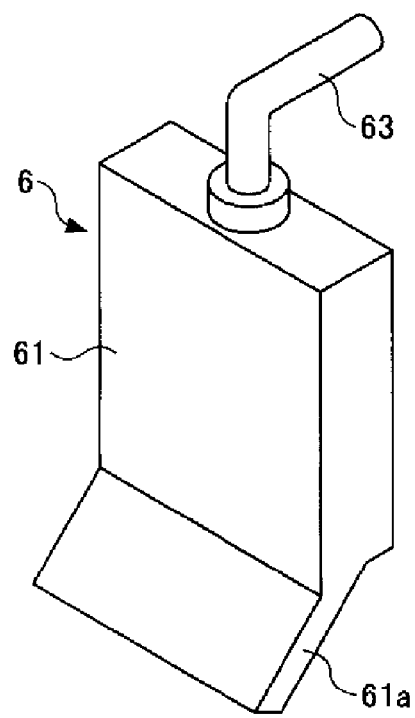
FIGS. 5A and 5B show a cleaning solution nozzle provided in the developing unit.
Figure 5B:
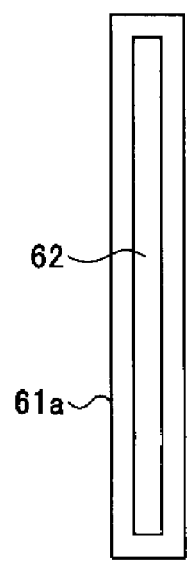
Figure 6:
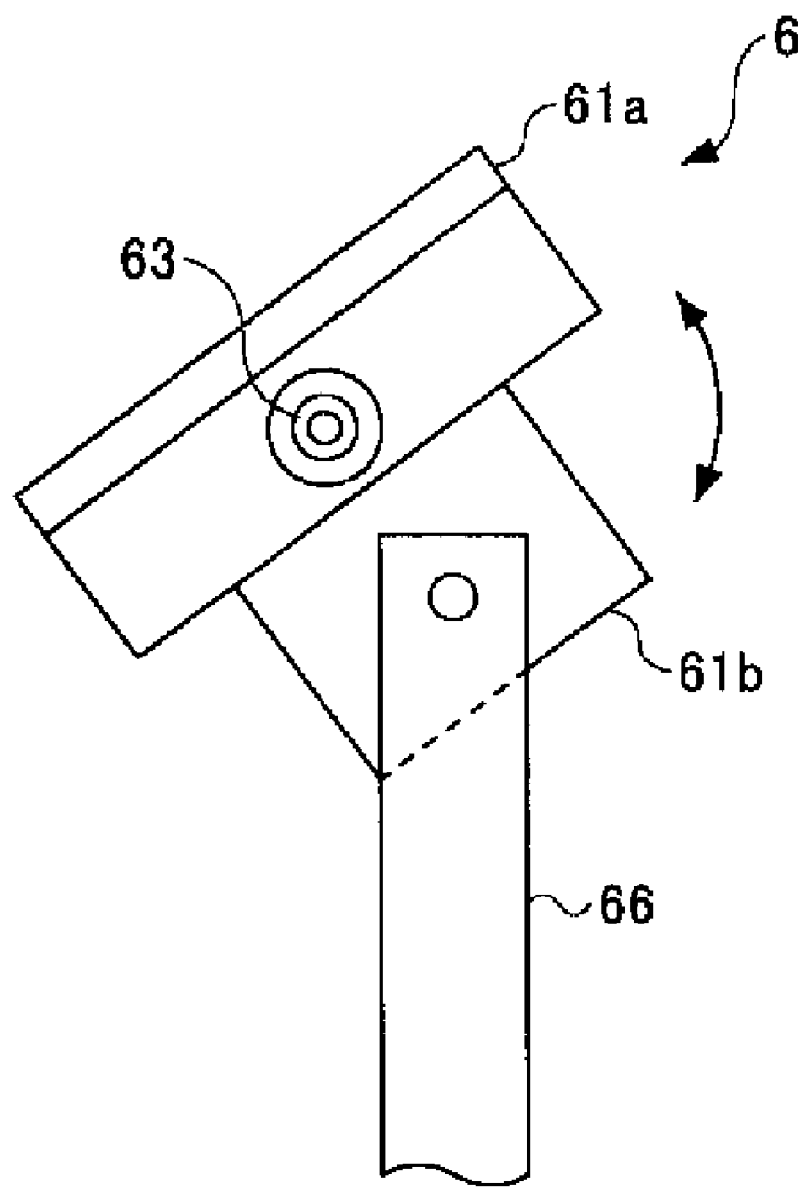
FIG. 6 is a plane view of the cleaning solution nozzle provided in the developing unit.
Figure 7:
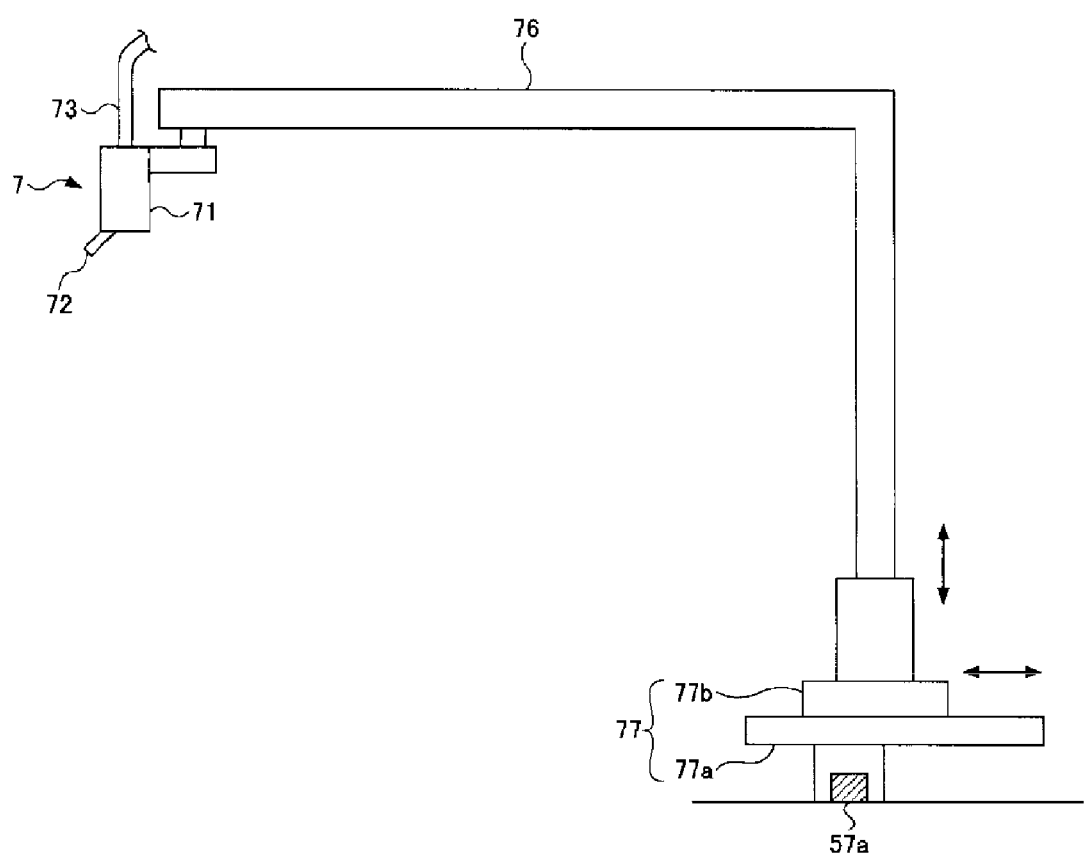
FIG. 7 is a side view of a gas nozzle and a nozzle driving mechanism provided in the developing unit.

Hereinafter, the developing unit (DEV) 28 will be explained with reference to FIGS. 3 to 7. FIG. 3 is a longitudinal cross sectional view of the developing unit. FIG. 4 is a schematic plane view of the developing unit. FIGS. 5A and 5B show a cleaning solution nozzle provided in the developing unit. To be specific, FIG. 5A is a perspective view of the cleaning solution nozzle and FIG. 5B shows an inclined lower part of the cleaning solution nozzle when viewed from the bottom thereof. FIG. 6 is a plane view of the cleaning solution nozzle provided in the developing unit. FIG. 7 is a side view of a gas nozzle and a nozzle driving mechanism provided in the developing unit.

As depicted in FIGS. 3 and 4, the developing unit (DEV) 28 includes a case 41, a shutter 42, a cup 43, a wafer holder 44, a discharge line 45, supporting pins 46, a developing solution nozzle 5, a cleaning solution nozzle 6, a gas nozzle 7, and a controller 100.

The case 41 serves as an exterior body of the apparatus. The shutter 42 is provided at the case 41 and opens and closes a transfer port for the wafer W. The cup 43 is provided within the case 41. The wafer holder 44 is provided so as to be rotatable around a vertical shaft within the cup 43. The wafer holder 44 is configured to horizontally hold and rotate the wafer. The wafer holder 44 includes a driving unit 44a. The driving unit 44a is configured to rotate the wafer holder 44. The discharge line 45 is connected with a bottom portion of the cup 43. The discharge line 45 is exhausted by a non-illustrated exhaust mechanism and a gas-liquid division unit is provided on the discharge line 45. The supporting pins 46 are configured as, for example, three pins for supporting and elevating the wafer W. The supporting pins 46 include an elevating member 46a and an elevating mechanism 46b. The elevating member 46a is configured to hold the supporting pins 46. The elevating mechanism 46b is configured to move the elevating member 46a up and down.

The developing solution nozzle 5 is configured to supply a developing solution onto a surface of the wafer W. In the same manner as the cleaning solution nozzle 6 to be described later with reference to FIGS. 5A and 5B, the developing solution nozzle 5 includes a strip-shaped discharge opening, for example, a slit-shaped discharge opening. An upper portion of the developing solution nozzle is connected with a developing solution supply line 53. Further, the developing solution supply line 53 is connected with a developing solution supply source 55 via a group of supply devices 54 including a valve or a flow rate control unit as depicted in FIG. 3.

As depicted in FIG. 4, the developing solution nozzle 5 is fixed at an arm 56 and the arm 56 is configured to move in an X direction and in a vertical direction. The arm 56 is bent in an L shape and configured to straightly move along a guide rail 57a (in the X direction) at the bottom of the case 41 by a driving mechanism 57 in the same manner as an arm 76 to be described later with reference to FIG. 7. Further, by way of example, the arm 56 can be moved in the vertical direction by an elevating mechanism included in the driving mechanism 57.

The cleaning solution nozzle 6 is configured to supply a cleaning solution onto the surface of the wafer W. As depicted in FIGS. 5A and 5B, the cleaning solution nozzle 6 includes a bent lower part 61a and a square tube-shaped main body 61, and the cleaning solution nozzle 6 is configured to supply a cleaning solution to the surface of the wafer W through a slit-shaped discharge opening 62 formed on the underside of the lower part 61a in a slanted direction. The discharge opening 62 is not limited to a slit-shaped one and, for example, may be formed of a plurality of round holes of a small diameter arranged at the lower part 61a of the main body 61 in a longitudinal direction thereof.

An upper part of the main body 61 of the cleaning solution nozzle 6 is connected with a cleaning solution supply line 63 as depicted in FIG. 5A. Further, the cleaning solution supply line 63 is connected with a cleaning solution supply source 65 that supplies a cleaning solution such as pure water via a group of supply devices 64 including a valve or a flow rate control unit as depicted in FIG. 3.

As depicted in FIG. 6, the main body 61 of the cleaning solution nozzle 6 is connected with an arm 66 via a support 61b on its rear surface so as to adjust the direction of the main body 61 around the vertical shaft. As depicted in FIG. 4, in the same manner as an arm 76 to be described later with reference to FIG. 7, the arm 66 is bent in an L shape and configured to straightly move along a guide rail 57a (in the X direction) at the bottom of the case 41 by a driving mechanism 67. Further, by way of example, the arm 66 can be moved in the vertical direction by an elevating mechanism included in the driving mechanism 67.

By the X-directional movement of the arm 66, the discharge opening 62 of the cleaning solution nozzle 6 can be moved from a central area of the wafer W, which is attracted to and held on the wafer holder 44, to a periphery area of the wafer W in the X direction. Further, the main body 61 is fixed at the arm 66 while the discharge opening is slightly inclined from the X direction toward a rotation direction of the wafer, i.e., a clockwise direction.

The gas nozzle 7 is configured to supply an inert gas onto the surface of the wafer W. That is, it blows the inert gas. The gas nozzle 7 has the same configuration as the cleaning solution nozzle 6 as depicted in FIGS. 5A, 5B and 6. Further, the gas nozzle 7 has a main body 71, and the main body 71 is fixed at the arm 76 bent in an L shape as depicted in FIG. 7. The gas nozzle 7 is different from the cleaning solution nozzle 6 in that the arm 76 can be moved in the X direction and in the vertical direction by a driving mechanism 77 and can also be moved in a forward/backward direction (Y direction). That is, the driving mechanism 77 includes an X-directional moving body 77a and a Y-directional moving body 77b. Further, the arm 76 can be moved along the guide rail 57a in the X direction by the X-directional moving body 77a and can be moved along a forward/backward direction (Y direction) with respect to the X-directional moving body 77a by the Y-directional moving body 77b.

In FIG. 7, reference numeral 72 denotes a discharge opening and reference numeral 73 denotes a gas supply line. In FIG. 3, reference numeral 74 denotes a group of supply devices and reference numeral 75 denotes a gas supply source for supplying an inert gas such as a nitrogen gas.

The controller 100 includes a computer and a storage unit. As depicted in FIGS. 3 and 4, the controller 100 outputs a control signal for controlling the driving mechanisms 57, 67, and 77, the driving unit 44a that rotates the wafer holder 44, and the groups of supply devices 54, 64, and 74 according to a program stored in the non-illustrated storage unit.

Figure 8:
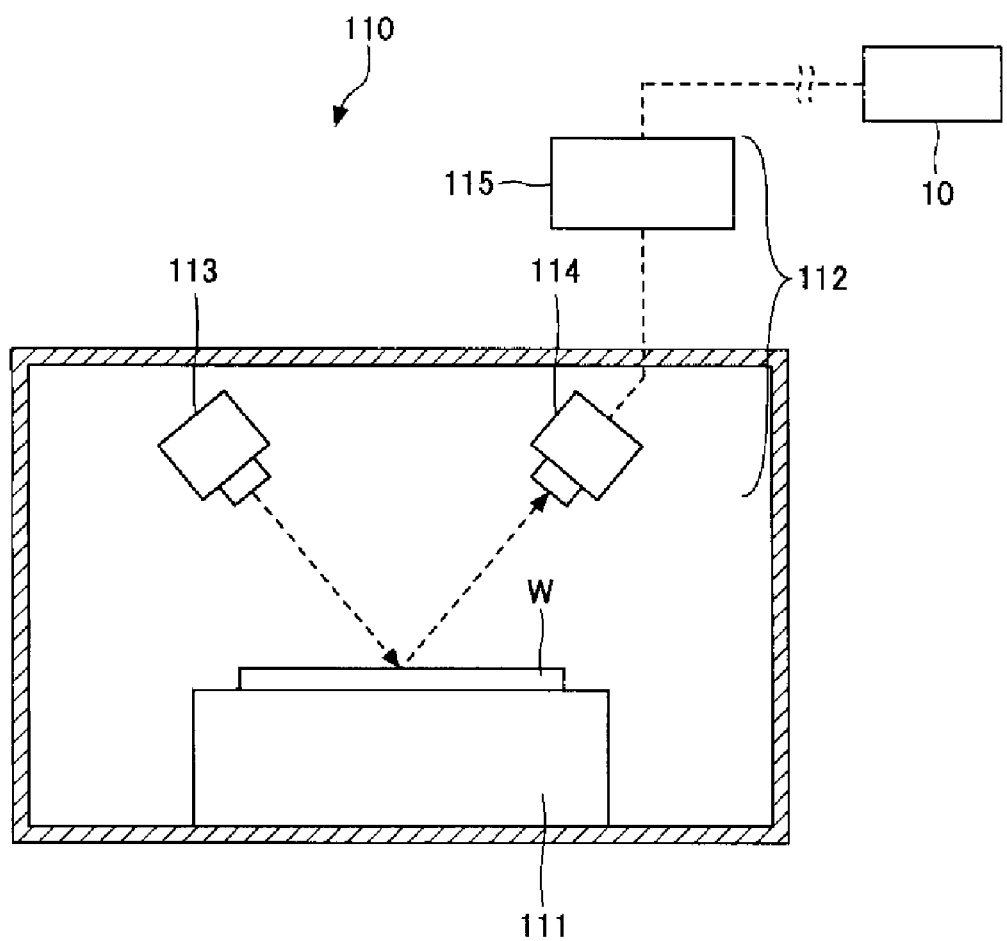
FIG. 8 is a longitudinal cross sectional view showing a schematic configuration of a line width measurement apparatus.

Hereinafter, referring to FIG. 8, the line width measurement apparatus 110 will be explained. FIG. 8 is a longitudinal cross sectional view showing a schematic configuration of the line width measurement apparatus.

The line width measurement apparatus 110 includes, for example, a mounting table 111 that horizontally mounts the wafer W thereon and an optical surface shape measurement device 112 as depicted in FIG. 8. By way of example, the mounting table 111 is configured as an X-Y stage, and, thus, it can be moved in a two-dimensional direction of a horizontal direction. The optical surface shape measurement device 112 includes, for example, a light irradiation unit 113, a light detection unit 114, and a calculation unit 115. The light irradiation unit 113 irradiates lights to the wafer W in an inclined direction. The light detection unit 114 detects lights irradiated from the light irradiation unit 113 and then reflected from the wafer W. The calculation unit 115 calculates a line width CD of a resist pattern on the wafer W based on information on the received light of the light detection unit 114. The line width measurement apparatus 110 measures a line width of the resist pattern by using, for example, a scatterometry method. In case of using the scatterometry method, the calculation unit 115 compares a distribution of light intensities on the surface of the wafer W detected by the light detection unit 114 with a virtual distribution of light intensities previously stored therein. Then, a line width CD of the resist pattern corresponding to the compared virtual distribution of light intensities is obtained, and, thus, the line width CD of the resist pattern can be measured.

Further, the line width measurement apparatus 110 horizontally moves the wafer W relative to the light irradiation unit 113 and the light detection unit 114, so that line widths at multiple measurement points on the surface of the wafer W can be measured.

By way of example, while a first processing condition such as a processing time t of a cleaning process performed by the developing unit (DEV) 28 for each wafer W is being modified, a first patterning process is performed on each wafer W in a wafer set including multiple wafers W. Accordingly, a first-time resist pattern (first resist pattern) P1 is formed. Thereafter, a second pattering process is performed on each wafer W having thereon the first resist pattern, so that a second-time resist pattern (second resist pattern) P2 is formed thereon. Then, a line width CD2 of the second resist pattern P2 is measured by the line width measurement apparatus 110. By way of example, a measurement result of the line width measurement apparatus 110 is outputted from the calculation unit 115 to the main controller 10 to be described later. Consequently, first data showing a relationship between the first processing condition such as the processing time t and the line width CD2 of the second resist pattern P2 are prepared.

A wafer process performed by the substrate processing system configured as described above is controlled by the main controller 10 depicted in FIG. 1. The main controller controls the line width measurement apparatus 110 to measure a line width of a resist pattern on the wafer W. The main controller 10 includes a general-purpose computer having, for example, a CPU and a memory and controls a wafer process or a measurement of a line width by executing a program stored therein. Further, the program of the main controller 10 may be installed in the main controller 10 by means of a computer readable storage medium.

Figure 9:
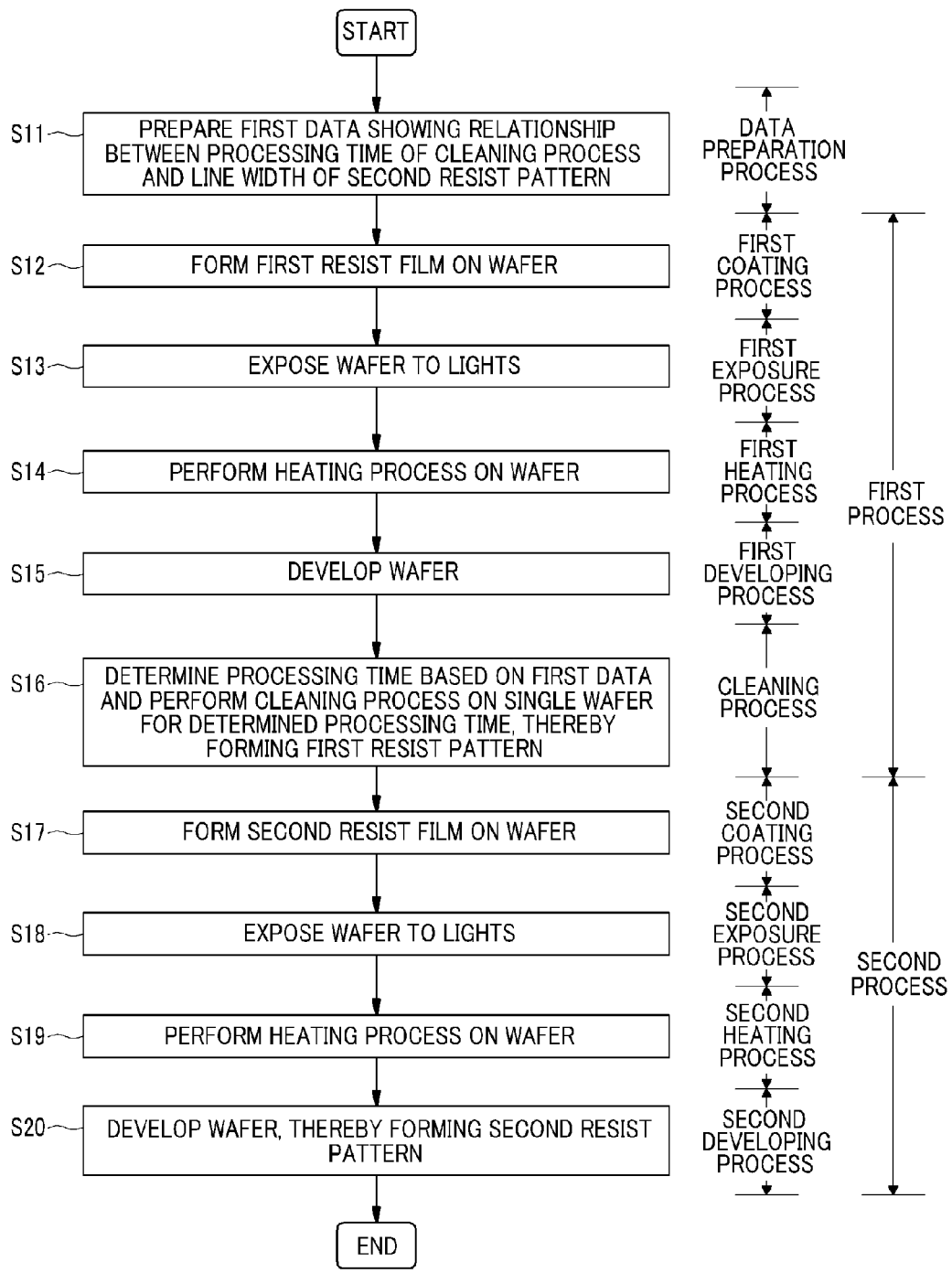
FIG. 9 is a flow chart for explaining a sequence of processes of a substrate processing method in accordance with the first embodiment.
Figure 10A:
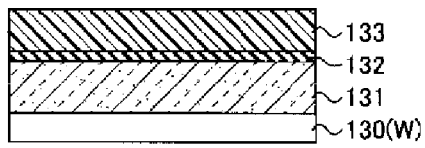
FIGS. 10A to 10J are cross sectional views showing a status of a wafer in each process of the substrate processing method in accordance with the first embodiment.
Figure 10B:
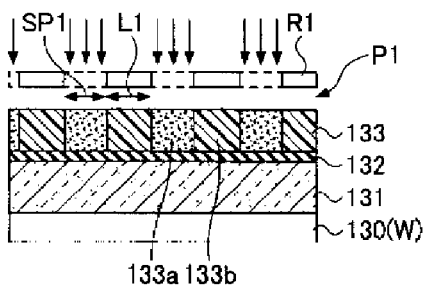
Figure 10C:
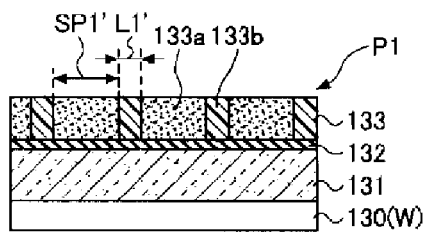
Figure 10D:
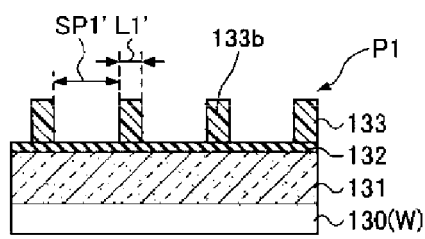
Figure 10E:
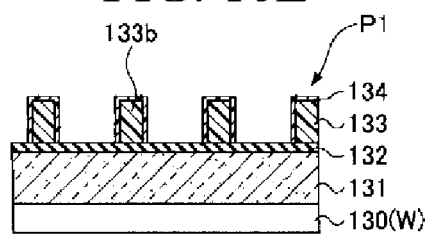
Figure 10F:
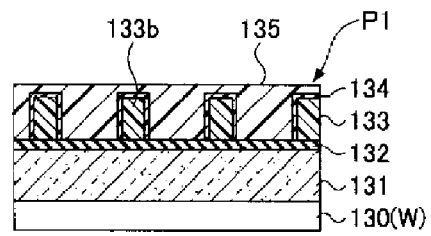
Figure 10G:
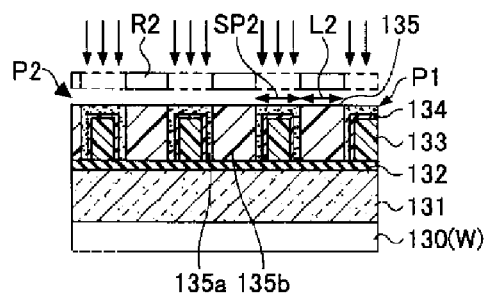
Figure 10H:
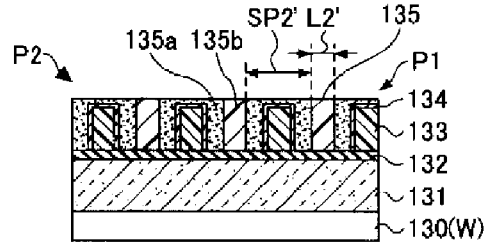
Figure 10I:
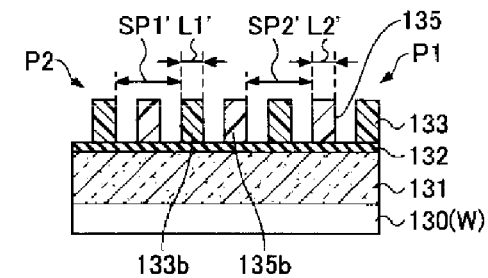

Hereinafter, referring to FIGS. 9 to 11A and 11B, a substrate processing method using the substrate processing system in accordance with the present embodiment will be explained. FIG. 9 is a flow chart for explaining a sequence of processes of a substrate processing method in accordance with the present embodiment. FIGS. 10A to 10J are cross sectional views showing a status of a wafer in each process of the substrate processing method in accordance with the present embodiment. FIGS. 11A and 11B are plane views showing a status of a wafer in each process of a cleaning process in accordance with the present embodiment.

As depicted in FIG. 9, the substrate processing method in accordance with the present embodiment includes a data preparation process (step S11), a first process (steps S11 to S16), and a second process (steps S17 to S20). The first process (step S12 to S16) includes a first coating process (step S12), a first exposure process (step S13), a first heating process (step S14), a first developing process (step S15), and a cleaning process (step S16). The second process (steps S17 to S20) includes a second coating process (step S17), a second exposure process (step S18), a second heating process (step S19), and a second developing process (step S20).

First of all, the data preparation process (step S11) is performed. In the data preparation process (step S11), first data showing a relationship between a first processing condition under which a cleaning process is performed on the wafer W in the cleaning process (step S16) and a space width SP2' of the second resist pattern P2 are prepared.

The first processing condition may include a processing time t for cleaning the wafer W, a temperature T of the cleaning solution, a flow rate F, and pH. Hereinafter, there will be explained a case where the processing time t for cleaning the wafer W is used as the first processing condition.

The first coating process (step S12) to the first developing process (step S15) to be described later are performed on each wafer W of the wafer set including the multiple wafers W. Then, the cleaning process (step S16) to be described later is performed while the processing time t is modified for each wafer W. Thereafter, by performing the second coating process (step S17) to the second developing process (step S20) to be described later, the first resist pattern P1 and the second resist pattern P2 are formed on the wafer W as described later with reference to FIGS. 10A to 10J. Subsequently, the space width SP2' of the formed second resist pattern P2 is measured by the line width measurement apparatus 110. In this way, the first data showing a relationship between the processing time t and the space width SP2' of the second resist pattern P2 are prepared.

Further, the space width SP2' of the second resist pattern P2 corresponds to the line width of the second resist pattern of the present disclosure.

Then, the first process (step S12 to S16) is performed on a single wafer W.

First, the first coating process (step S12) is performed on the single wafer W. In the first coating process (step S12), a first resist film 133 is formed by coating the single wafer W with a resist. FIG. 10A shows a status of the wafer in the first coating process (step S12).

Prior to the first coating process (step S12), a bottom antireflection film 132 is formed on the wafer 130 (wafer W) on which an etching target film 131 is previously formed.

The carrier C1 in which multiple wafers W are accommodated is loaded into the carrier mounting unit B1 from the outside; a single sheet of the wafer W is taken out from the inside of the carrier C1 by the transit mechanism A1; and then the wafer W is loaded into the processing unit B2. The wafer W loaded into the processing unit B2 is delivered to the main transfer mechanism A2 through a transit unit of the rack unit U1. The wafer W delivered to the main transfer mechanism A2 is loaded into the antireflection film forming unit BARC of the liquid processing unit U4. The bottom antireflection film (BARC) 132 is formed on the wafer 130 (wafer W), on which the etching target film 131 has been formed, in the antireflection film forming unit BARC.

The wafer 130 (wafer W) on which the bottom antireflection film 132 has been formed is loaded into the coating unit (COT) 27 by the main transfer mechanism A2 through a delivery unit of the rack unit U2. The first resist film 133 is formed on a top of the bottom antireflection film (BARC) 132 of the wafer 130 (wafer W) loaded into the coating unit (COT) 27.

A resist used for forming the first resist film 133 may be a chemically amplified resist. As a specific example, it may be possible to use a chemically amplified positive resist which can respond to an exposure using an ArF excimer laser (wavelength of about 193 nm) as a light source in the present embodiment.

Further, a top antireflection film (TARC) may be formed on a top of the first resist film 133.

The wafer W on which the first resist film 133 is formed is loaded into the heating unit of the rack unit U2 and the wafer W is baked at a predetermined temperature. The baked wafer W is cooled by the cooling unit of the rack unit U2 and then loaded into a transit unit of the rack unit U3 by the main transfer mechanism A3. Thus, the first-time coating process is ended.

Subsequently, the first exposure process (step S13) is performed on the single wafer W. In the first exposure process (step S13), the single wafer W on which the first resist film 133 is formed is exposed to lights. FIG. 10B shows a status of the wafer W in the first exposure process (step S13).

The wafer W loaded into the transit unit of the rack unit U3 is loaded into the exposure unit B4 via the first transfer chamber 3A and the second transfer chamber 3B by the first substrate transfer unit 31A and the second substrate transfer unit 31B. Then, the first-time exposure process is performed in the exposure unit B4.

In a non-illustrated exposure apparatus within the exposure unit B4, a non-illustrated lens is placed so as to face the surface of the wafer W at a distance, and pure water is supplied between the lens and the surface of the wafer W so as to form a liquid film (pure water film). Thereafter, lights from a non-illustrated light source pass through both the lens and the liquid film and are irradiated to the wafer W, so that a preset circuit pattern is transferred to the resist. Further, preset circuit patterns are transferred in sequence to the surface of the wafer W by repeatedly irradiating lights while transversely sliding the exposure apparatus, and, thus, the circuit patterns are exposed on the entire surface of the wafer W.

When the first-time exposure process is performed, as depicted in FIG. 10B, selected areas of the first resist film 133 are exposed to lights by using a first reticle R1, so that there are formed soluble areas 133a which can be dissolved by a developing solution made of, for example, an alkaline solvent. Since the soluble areas 133a are formed, the first pattern P1 includes the soluble areas 133a soluble in the developing solution and insoluble areas 133b insoluble therein in the first resist film 133.

Herein, the first pattern P1 is obtained by using the first reticle R1 having lines. As depicted in FIG. 10B, a line width L1 and a space width SP1 of the first pattern P1 can be set to be, for example, about 32 nm and about 32 nm, respectively.

Subsequently, the first heating process (step S14) is performed on the single wafer W. In the first heating process (step S14), the single wafer W is heated. FIG. 10C shows a status of the wafer in the first heating process (step S14).

The wafer W on which the first-time exposure process has been performed is taken out from the exposure unit B4 by the second substrate transfer unit 31B, and water on the surface of the substrate is removed by the substrate cleaning apparatus 4, and then the wafer W is loaded into the heating unit PEB of the rack unit U6.

In the heating unit PEB, the transferred wafer W is mounted on a non-illustrated heating plate via a non-illustrated cooling plate and non-illustrated elevating pins and a heating process (baking process after the exposure) is performed on the wafer W. After a preset time, the wafer W is separated from the heating plate by the elevating pins, and, thus, the heating process on the wafer W is ended. Thereafter, the wafer W is delivered from the elevating pins to the cooling plate and cooled by the cooling plate, and then the wafer W is transferred to the outside of the heating unit PEB from the cooling plate.

As the first heating process (step S14) is performed, a part of the insoluble areas 133b is changed into the soluble areas 133a. Therefore, as depicted in FIG. 10C, the line width L1 of the first pattern P1 is slightly decreased to L1' and the space width SP1 of the first pattern P1 is slightly increased to SP1'.

Then, the first developing process (step S15) and the cleaning process (step S16) are consecutively performed on the single wafer W. FIG. 10D shows a status of the wafer after the first developing process (step S15) and the cleaning process (step S16).

The first developing process (step S15) is first performed. In the first developing process (step S15), the single wafer W on which the first heating process (step S14) has been performed is developed.

The wafer W on which the first heating process (step S14) has been performed is unloaded from the heating unit PEB by the first substrate transfer unit 31A and delivered to the main transfer mechanism A3 via the transit unit of the rack unit U3. Then, the wafer W is loaded into the developing unit (DEV) 28 by the main transfer mechanism A3.

In the developing unit (DEV) 28, the shutter 42 is opened and the main transfer mechanism A3 mounting thereon the wafer W on which the first-time heating process has been performed is loaded into the case 41. Then, the wafer W on the main transfer mechanism A3 is received by elevating the supporting pins 46 and the received wafer W is delivered to the wafer holder 44. Subsequently, the main transfer mechanism A3 is retreated and the shutter 42 is closed. The arm 56 is driven such that the developing solution nozzle 5 is positioned above a central area of the wafer W. Accordingly, a supply position of the developing solution by the developing solution nozzle 5 is located above a central area, i.e., the center, of the wafer W.

Thereafter, the wafer W is rotated around the vertical shaft, and while the developing solution is discharged in a strip-shape through the discharge opening of the developing solution nozzle 5, the developing nozzle 5 is moved from the central area of the wafer W toward the periphery area of the wafer W. Thus, the supply position of the developing solution to the wafer W can be moved from the central area of the wafer W to the periphery area of the wafer W and the developing solution is supplied in a spiral shape to the entire surface of the wafer W. By supplying the developing solution to the surface of the wafer W from the developing solution nozzle 5, the first resist film 133 on the wafer W is developed. As the developing solution, it may be possible to use an alkaline solvent such as tetramethyl ammonium hydroxide (TMAH).

After the first developing process (step S15) is performed as described above, the cleaning process (step S16) is performed. In the cleaning process (step S16), the processing time t is determined based on the first data. For the processing time t, the cleaning process is performed on the single wafer W after the first developing process (step S15), so that the first resist pattern P1 is formed. Further, in the cleaning process (step S16), a cleaning solution supplying process is performed together with a gas supplying process. In the cleaning solution supplying process, the developed wafer W is rotated, and while a supply position of the cleaning solution to the rotating wafer W is being moved from the central area toward the periphery area of the wafer W, the cleaning solution is supplied to the wafer W. In the gas supply process, the gas is supplied toward the periphery area of the wafer W at a downstream position of the moving supply position of the cleaning solution in a rotation direction of the wafer W.

Further, the processing time t includes a time for performing the cleaning solution supplying process. Furthermore, a method of determining the processing time t based on the first data will be explained later.

To be specific, the developing nozzle 5 is retreated from the wafer W. As depicted in FIG. 11A, the cleaning solution nozzle 6 is positioned such that the supply position of the cleaning solution to the wafer W through the cleaning solution nozzle 6 is positioned above the central area of the wafer W. At this time, the discharge opening 62 of the cleaning solution nozzle 6 is slightly inclined from the X direction toward a rotation direction of the wafer W, i.e., a clockwise direction. Further, the gas nozzle 7 is positioned such that a supply position of the gas to the wafer W through the gas nozzle 7 is positioned slightly upstream (right side of FIG. 11A) of the discharge opening 62 in a scan direction of the cleaning solution nozzle 6 and positioned slightly downstream in a rotation direction of the wafer W. At this time, the gas nozzle 7 is driven by the arm 76. Further, the discharge opening 72 of the gas nozzle 7 and the discharge opening 62 of the cleaning solution nozzle 6 face the same direction.

The wafer W is rotated in a clockwise direction at a rotational speed of, for example, about 500 rpm or less, for example, about 200 rpm, and the cleaning solution is discharged from the discharge opening 62 of the cleaning solution nozzle 6 at a flow rate of, for example, about 250 ml/min. Thus, the cleaning solution is supplied in a thin strip shape and collides, from an inclined upper area, with the central area of the wafer W including the center thereof. At the same time, a nitrogen gas is blown from the discharge opening 72 of the gas nozzle 7. Since the wafer W is rotated in the clockwise direction, the cleaning solution supplied onto the wafer W is influenced by a centrifugal force working from the center to the periphery and a rotatory force working in a rotation direction of the wafer W, and, thus, a vortex gas flow is generated. A dashed line of FIG. 11A indicates a rice-ear-shaped liquid flow after the cleaning solution is discharged to the center of the wafer W through the cleaning solution nozzle 6 if the gas is not blown.

Meanwhile, if the nitrogen gas is blown through the gas nozzle 7 at a flow rate of, for example, about 5 l/min toward the outside with respect to the liquid flow at a downstream position of the supply position of the cleaning solution, the rice-ear-shaped liquid flow is forced to move toward the periphery area of the wafer W as indicated by a solid line of FIG. 11A.

In this state, the cleaning solution nozzle 6 moves along the X direction at a scan speed of, for example, about mm/sec toward an injection direction of the cleaning solution, i.e., toward the left side of FIG. 11A. Further, the gas nozzle 7 also moves in substantially the same direction and the same speed as the cleaning solution nozzle 6. However, the gas nozzle 7 is moved not only along the X direction, but also along a slight Y-direction and an injection direction of the gas, i.e., toward the front side by the driving mechanism 77. Thus, the supply position of the cleaning solution and the supply position of the nitrogen gas become farther apart from each other as they move to the periphery area of the wafer W.

FIG. 11B shows the cleaning solution nozzle 6 and the gas nozzle 7 which move while supplying the cleaning solution and the nitrogen gas, respectively. The liquid flow of the cleaning solution is discharged from the cleaning solution nozzle 6 and extended in a rice-ear shape in the clockwise direction, and an outward gas flow is blown from the gas nozzle 7 to the liquid flow. Accordingly, the liquid flow of the cleaning solution is forced to move toward the outside while both nozzles 6 and 7 move toward the periphery area of the wafer W (toward the outside). Consequently, a ring-shaped coating area 200 of the cleaning solution is formed on the wafer W and an inner circumference of the ring, i.e., a dried area 300 spreads toward the outside. In this way, the cleaning solution nozzle 6 and the gas nozzle 7 scan the wafer W to the periphery area of the wafer W.

As described above, the soluble areas 133a of the first resist film 133 are dissolved and removed by performing the first developing process (step S15) and the cleaning process (step S16), and as depicted in FIG. 10D., only the insoluble areas 133b remain and the first resist pattern P1 is formed.

After the cleaning process (step S16), the cleaning solution nozzle 6 and the gas nozzle 7 are raised and retreat from an upper area of the cup 43. Further, the wafer W on which the cleaning process has been performed is unloaded by the main transfer mechanism A3 in the reverse sequence to loading of the wafer W. The wafer W unloaded by the main transfer mechanism A3 is transferred to the heating unit and the cooling unit in sequence and then a preset process such as a post-baking process has been performed on the wafer W. Then, the single wafer W having first resist pattern P1 is transferred to the transit unit of the rack unit U1. Thus, the first-time developing process is ended.

Subsequently, the second process (steps S17 to S20) is performed on the single wafer W.

The second coating process (step S17) is performed on the single wafer W. In the second coating process (step S17), the single wafer W is coated with a resist, and a second resist film 135 is formed. FIGS. 10E and 10F show statuses of the wafer in the second coating process (step S17).

The wafer W within the transit unit of the rack unit U1 is transferred by the main transfer mechanism A2 to a heating unit, a cooling unit, and a curing unit in sequence included in any one of the rack units U1 to U3. Then, a cleaning process and a surface treatment such as a curing process using irradiation of ultraviolet lights are performed on the pattern formed by the first-time coating, exposure, developing processes. Consequently, it is possible to prevent adhesion of particles or occurrence of leaching during a second-time coating process. As depicted in FIG. 10E, in the first resist pattern P1 on which the curing process has been performed, its surface 134 is cured. Then, the wafer W is returned to the transit unit of the rack unit U1.

Thereafter, the wafer W in the transit unit of the rack unit U1 is transferred by the main transfer mechanism A2 to the coating unit (COT) 27, the heating unit, and the cooling unit in sequence, in which preset processes are performed. Consequently, as depicted in FIG. 10F, the second resist film 135 is formed on the wafer W having the first resist pattern P1.

A resist used for forming the second resist film 135 may be a chemically amplified resist, and it may be possible to use a chemically amplified positive resist which can respond to an exposure using an ArF excimer laser (wavelength of about 193 nm) as a light source. Further, a top antireflection film (TARC) may be formed on a top of the second resist film 135.

Then, the wafer W on which the second resist film 135 is formed is loaded into the transit unit of the rack unit U3 by the main transfer mechanism A3. Thus, a second-time coating process is ended.

Subsequently, the second exposure process (step S18) is performed on the single wafer W. In the second exposure process (step S18), the single wafer W on which the second resist film 135 is formed is exposed to lights. FIG. 10G shows a status of the wafer W in the second exposure process (step S18).

The wafer W loaded into the transit unit of the rack unit U3 is loaded into the exposure unit B4 via the first transfer chamber 3A and the second transfer chamber 3B by the first substrate transfer unit 31A and the second substrate transfer unit 31B. Then, a second-time exposure process is performed in the exposure unit B4.

When the second-time exposure is performed, as depicted in FIG. 10G, selected areas of the second resist film 135 are exposed to lights by using a second reticle R2, so that there are formed soluble areas 135a which can be dissolved by a developing solution made of, for example, an alkaline solvent. Since the soluble areas 135a are formed, the second pattern P2 includes the soluble areas 135a soluble in the developing solution and insoluble areas 135b insoluble therein in the second resist film 135.

Herein, the second pattern P2 is obtained by using the second reticle R2 having lines. As depicted in FIG. 10G, a line width L2 and a space width SP2 of the second pattern P2 can be set to be, for example, about 32 nm and about 32 nm, respectively.

Subsequently, the second heating process (step S19) is performed on the single wafer W. In the second heating process (step S19), the single wafer W is heated. FIG. 10H shows a status of the wafer in the second heating process (step S19).

The wafer W on which the second-time exposure process has been performed is taken out from the exposure unit B4 by the second substrate transfer unit 31B, and water on the surface of the substrate is removed by the substrate cleaning apparatus 4, and then the wafer W is loaded into the heating unit PEB of the rack unit U6. Thereafter, a second-time heating process is performed in the same manner as the first-time heating process.

As the second heating process (step S19) is performed, a part of the insoluble areas 135b is changed into the soluble areas 135a. Therefore, as depicted in FIG. 10H, the line width L2 of the second pattern P2 is slightly decreased to L2' and the space width SP2 of the second pattern P2 is slightly increased to SP2'.

Then, the second developing process (step S20) is performed on the single wafer W. In the second developing process (step S20), the single wafer W on which the second heating process (step S19) has been performed is developed, and, thus, the second resist pattern P2 is formed. FIG. 10I shows a status of the wafer in the second developing process (step S20).

The single wafer W on which the second heating process (step S19) has been performed is unloaded from the heating unit PEB by the first substrate transfer unit 31A; delivered to the main transfer mechanism A3; and loaded into the developing unit (DEV) 28. Then, within the developing unit (DEV) 28, the second resist pattern 135 on the single wafer W is developed. In the second-time developing process, the soluble areas 135a of the second resist film 135 are dissolved and removed by an alkaline solvent such as THAH. Consequently, as depicted in FIG. 10I, only the insoluble areas 135b remain and the second resist pattern P2 is formed. After the second developing process (step S20), a non-illustrated second-time cleaning process may be performed.

The wafer W having the second resist pattern P2 is unloaded from the developing unit (DEV) 28 by the main transfer mechanism A3 and transferred to the heating unit and the cooling unit in sequence and then a preset process such as a post-baking process is performed on the wafer W. Then, the single wafer W having the second resist pattern P2 is transferred to the transit unit of the rack unit U1. Thus, the second-time developing process is ended.

The wafer W, on which the second-time developing process has been performed, in the transit unit of the rack unit U1 is returned to the carrier C1 on the mounting unit 20a after a line width of a resist pattern is measured by the line width measurement apparatus 110.

Figure 10J:
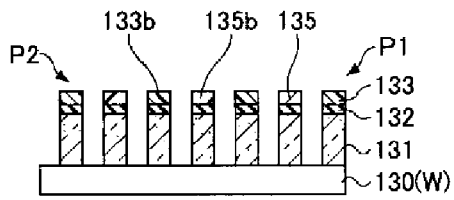
Figure 11A:
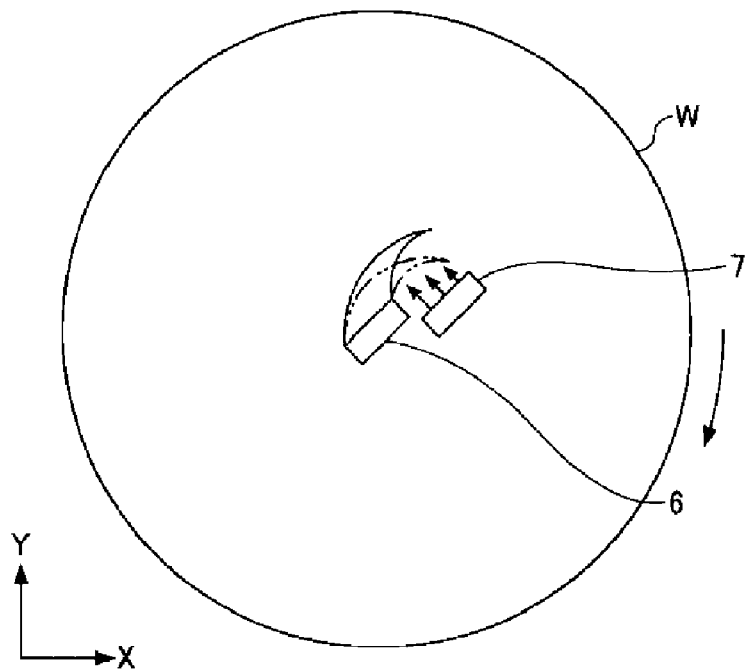
FIGS. 11A and 11B are plane views showing a status of the wafer in each process of a cleaning process in accordance with the first embodiment.
Figure 11B:
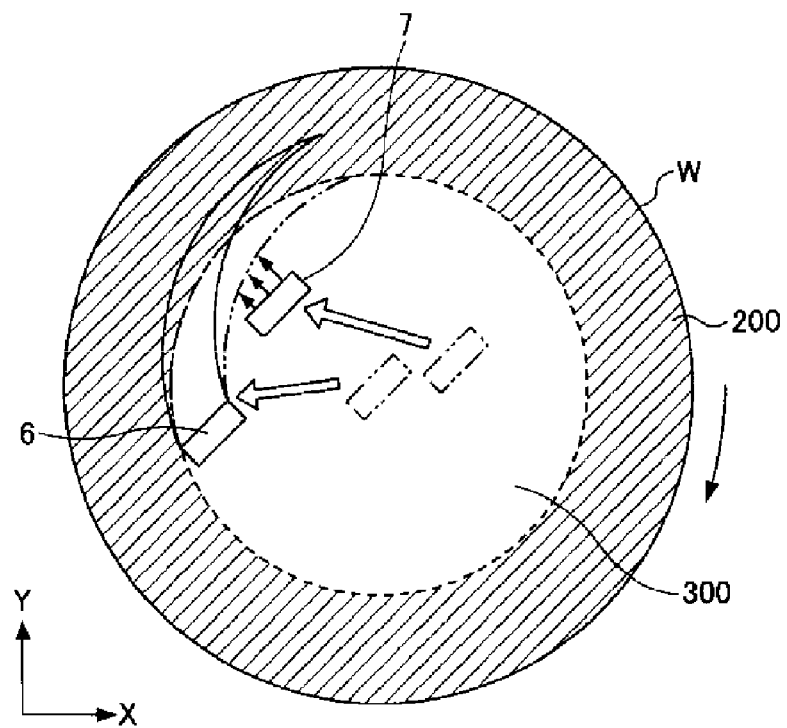

Further, as for the wafer W on which the substrate processing method including the second-time developing process in accordance with the present embodiment has been performed, the etching target film 131 may be etched as depicted in FIG. 10J by an etching apparatus installed separately from the substrate processing system.

Hereinafter, referring to FIG. 12, there will be explained a method of determining a processing time t in the cleaning process (step S16).

Figure 12:
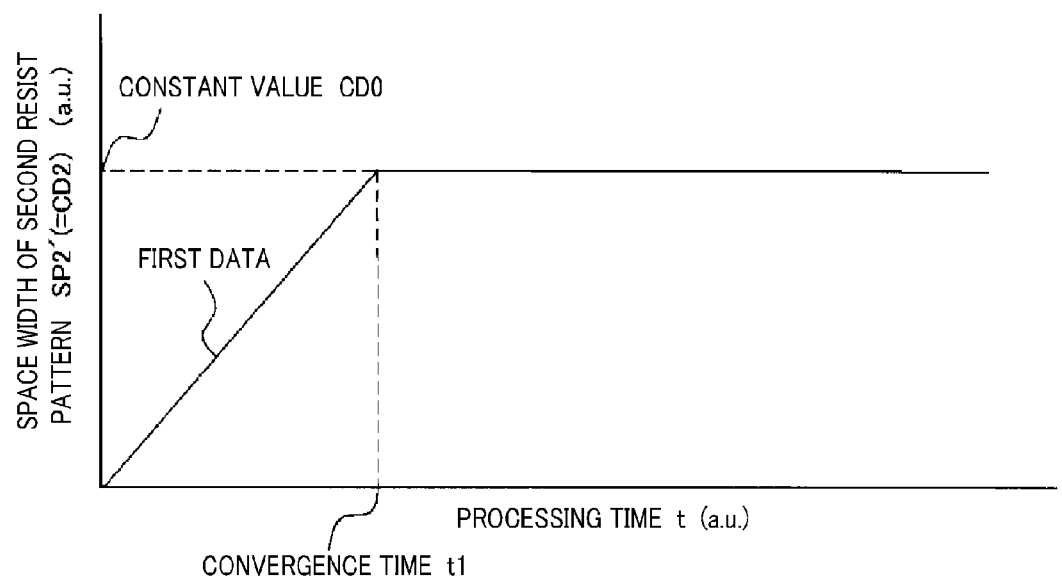
FIG. 12 is a graph schematically showing a relationship between a processing time and a space width of a second resist pattern.

FIG. 12 is a graph schematically showing a relationship between a processing time and a space width of a second resist pattern.

In a case where the processing time t for the cleaning process (step S16) is short, the space width SP2' of the second resist pattern P2 after the second heating process (step S19) is smaller than the space width SP2' in a case where the processing time t is long. This is because the developing solution supplied to the wafer W is not removed sufficiently and the developing solution such as an alkaline solvent remains on the surface of the wafer W in the first developing process (step S15).

Further, in a case where the processing time t for the cleaning process (step S16) is sufficiently long, even if the processing time t is further lengthened, the space width SP2' of the second resist pattern P2 is not changed. This is because the developing solution supplied to the wafer W is approximately completely removed and the developing solution does not remain on the surface of the wafer W in the first developing process (step S15).

Therefore, in the relationship between the processing time t and the space width SP2' (CD2) of the second resist pattern P2, as the processing time t is increased within a short processing time range, the space width SP2' (CD2) is increased, and finally saturated to a constant value CD0 after a time t1 as depicted in FIG. 12.

Meanwhile, if the line width CD2 of the second resist pattern P2 is defined as the line width L2' rather than the space width SP2', in the relationship between the processing time t and the line width L2' (CD2) of the second resist pattern P2, as the processing time t is increased within a short processing time range, the line width L2' (CD2) is decreased and finally converges to a constant value CD0 after the time t1. That is, in this case, as the processing time t is increased, the line width CD2 is changed and finally converges to the constant value CD0 after a convergence time t1.

If the processing time t is shorter than the convergence time t1, the line width CD2 of the second resist pattern P2 cannot be the constant value CD0 as an original value which can be obtained when a cleaning process is performed for a sufficiently long time. Further, if the processing time t is shorter than the convergence time t1, the line width CD2 is varied depending on the processing time t. Therefore, non-uniformity in the line width CD2 is likely to be increased between wafers or within a surface of the single wafer.

Meanwhile, if the processing time t is longer than the convergence time t1, the line width CD2 of the second resist pattern P2 can be the constant value CD0. Further, if the processing time t is longer than the convergence time t1, the line width CD2 becomes uniform regardless of the processing time t. Therefore, non-uniformity in the line width CD2 may be decreased between wafers or within a surface of the single wafer.

In the present embodiment, since the first data has been prepared in advance, the convergence time t1 can be measured accurately. Therefore, the processing time t is determined to be substantially the same as the convergence time t1, so that non-uniformity in the line width CD2 of the second resist pattern P2 in a wafer surface can be decreased without increasing the processing time t.

Hereinafter, referring to FIGS. 13A and 13B, there will be explained a comparison result of distribution of the line widths CD2 of the second resist pattern P2 in a wafer surface in the present embodiment and a comparative example 1 where the first data has not been prepared in advance.

Figure 13A:
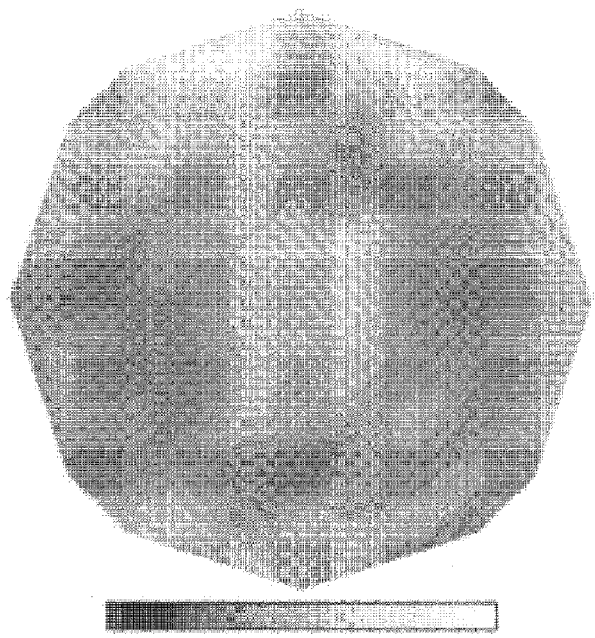
FIGS. 13A and 13B show distribution of space widths of a second resist pattern in a wafer surface obtained by performing substrate processing methods in accordance with the first embodiment and a comparative example 1.
Figure 13B:
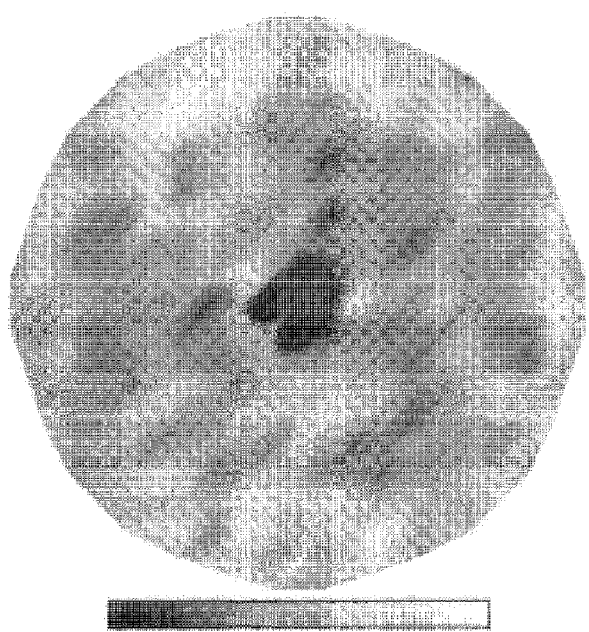

FIGS. 13A and 13B show distribution of space widths of a second resist pattern in a wafer surface obtained by performing substrate processing methods in accordance with the first embodiment and the comparative example 1, respectively. Further, FIGS. 13A and 13B show the distribution of the space widths represented by a gray scale using substantially the same upper and lower limit values.

In the comparative example 1, as depicted in FIG. 13B, an area having a small space width SP2' (line width CD2) (dark area) is observed at a central area of the wafer W and substantially the same value is not shown over the entire surface of the wafer W. Thus, it is deemed that, in the comparative example 1, a cleaning process is not sufficiently performed at the central area of the wafer W.

Meanwhile, in the present embodiment, as depicted in FIG. 13A, an area having a small space width SP2' (line width CD2) (dark area) is not observed at a central area of the wafer W and substantially the same value is shown over the entire surface of the wafer W. Thus, it is deemed that, in the present embodiment, a cleaning process is sufficiently performed at the central area of the wafer W.

Further, non-uniformity CD3σ in the space width SP2' (line width CD2) of the present embodiment is smaller than that of the comparative example 1. Therefore, in accordance with the present embodiment, non-uniformity in the space width SP2' (line width CD2) in a wafer surface can be decreased.

In the cleaning process, if the gas is supplied toward the periphery area of the wafer W at the downstream position of the supply position of the cleaning solution in the rotation direction of the wafer W, a supply amount of the cleaning solution is likely to be decreased at the central area of the wafer W as compared to the periphery area of the wafer W. Therefore, the present embodiment may have a great effect of decreasing non-uniformity in the line width CD2 of the second resist pattern P2 in a wafer surface without increasing the processing time t.

In the cleaning process (step S16) in accordance with the present embodiment, the convergence time t1 can be decreased by increasing a temperature T of the cleaning solution or a flow rate F of the cleaning solution.

Figure 14:
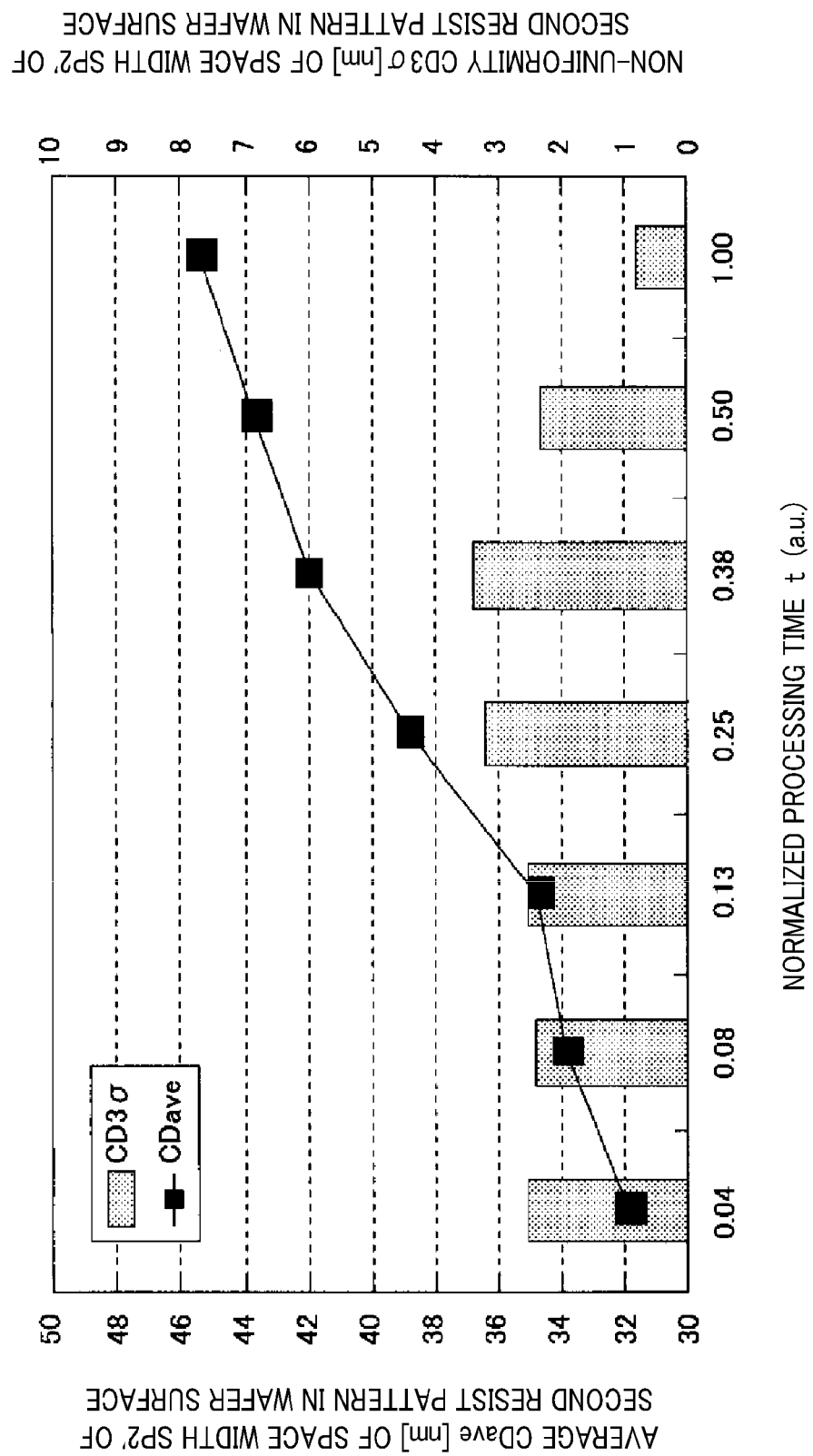
FIG. 14 is an example of first data showing a relationship between a processing time and a space width of a second resist pattern when a temperature or a flow rate of a cleaning solution is modified.
Figure 15:
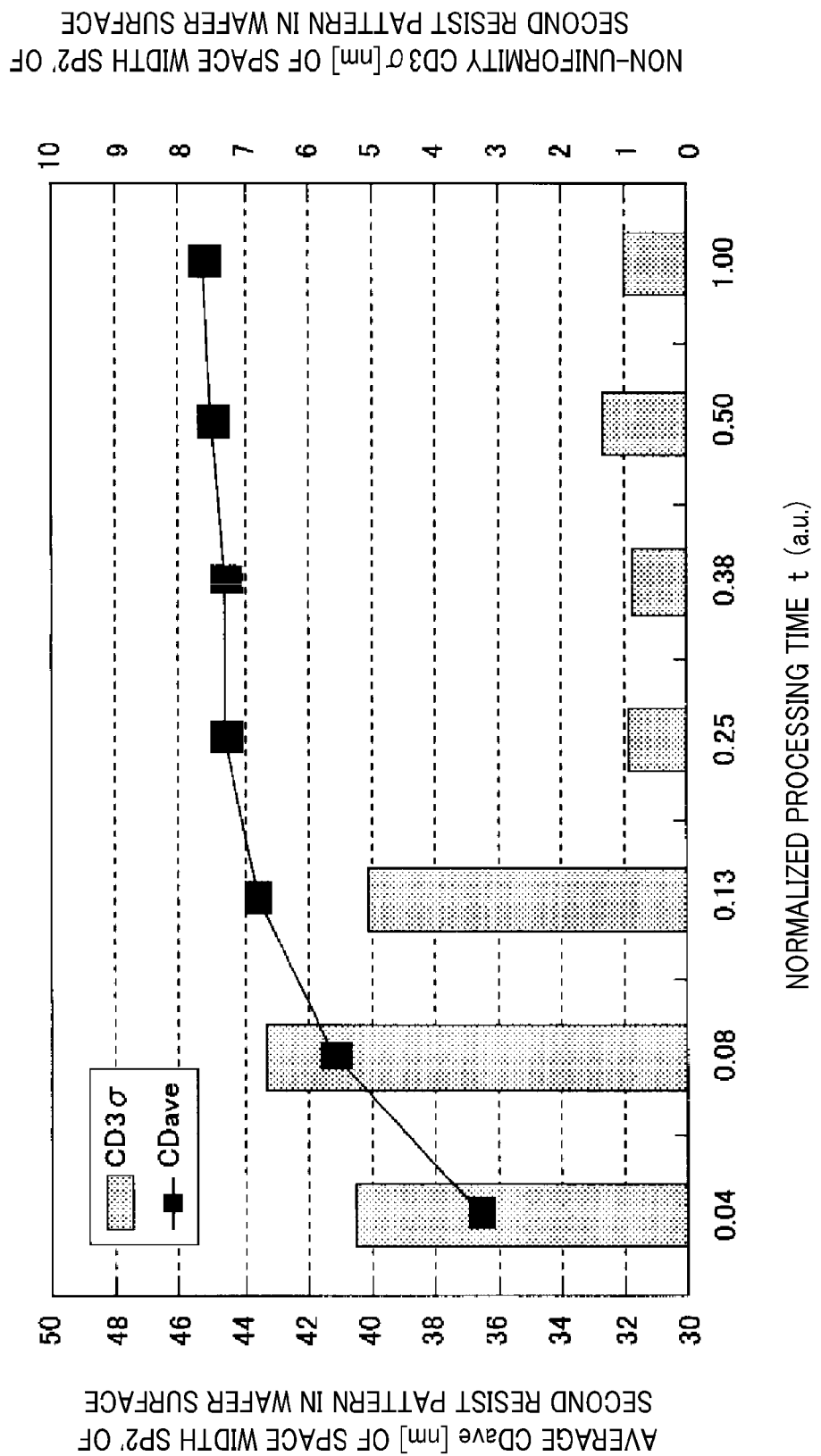
FIG. 15 is another example of first data showing a relationship between a processing time and a space width of a second resist pattern when a temperature or a flow rate of a cleaning solution is modified.
Figure 16:
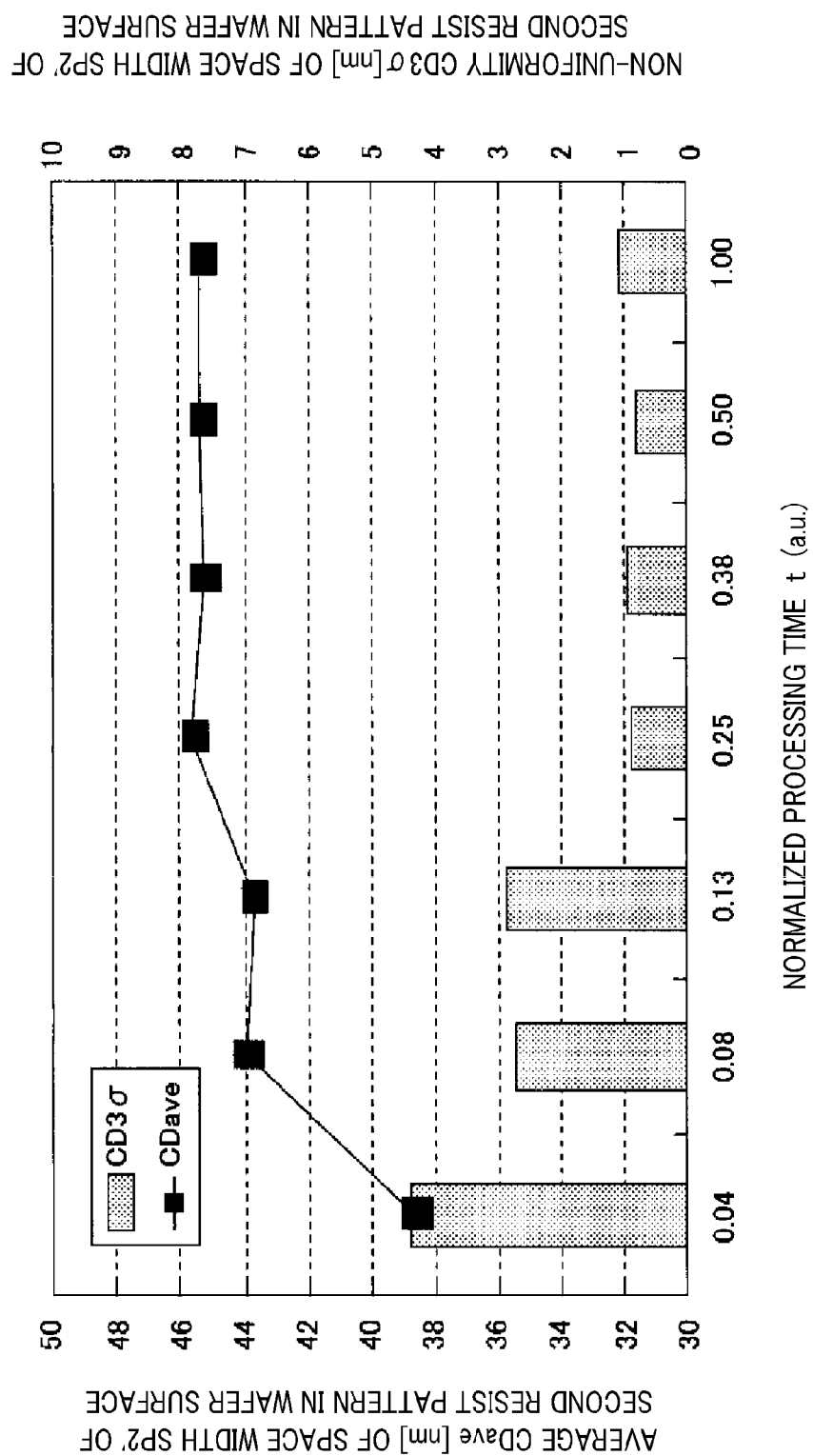
FIG. 16 is still another example of first data showing a relationship between a processing time and a space width of a second resist pattern when a temperature or a flow rate of a cleaning solution is modified.

FIGS. 14 to 16 show examples of first data showing a relationship between a processing time and a space width of a second resist pattern when a temperature or a flow rate of a cleaning solution is varied. FIG. 14 shows a case where a temperature of a cleaning solution is about 23° C. and a flow rate thereof is about 350 ml, FIG. 15 shows a case where a temperature of a cleaning solution is about 50° C. and a flow rate thereof is about 350 ml, and FIG. 16 shows a case where a temperature of a cleaning solution is about 23° C. and a flow rate thereof is about 800 ml.

In FIGS. 14 to 16, a processing time t is normalized by substantially the same maximum value. Further, a longitudinal axis on the left represents an average (line width average) CDave of the space width SP2' (line width CD2) of the second resist pattern P2 in a wafer surface. Furthermore, a longitudinal axis on the right represents non-uniformity (line width non-uniformity) CD3σ in the space width SP2' (line width CD2) of the second resist pattern P2 in a wafer surface.

In FIG. 14, the line width average CDave is increased as the processing time t is increased, and converges between the normalized processing time t 0.05 to 1.00. Further, as the processing time t is increased, the line width non-uniformity CD3σ is decreased, and converges between the normalized processing time t 0.05 to 1.00.

In FIG. 15, the line width average CDave is increased as the processing time t is increased, and the line width average CDave converges after the normalized processing time t of about 0.25. Further, the line width non-uniformity CD3σ is decreased as the processing time t is increased, and the line width average CDave converges after the normalized processing time t of about 0.25.

Further, in FIG. 16, the line width average CDave is increased as the processing time t is increased, and the line width average CDave converges after the normalized processing time t of about 0.25. Further, the line width non-uniformity CD3σ is decreased as the processing time t is increased, and the line width average CDave converges after the normalized processing time t of about 0.25.

By comparing FIG. 14 with FIG. 15, it can be seen that a convergence time t1 can be further decreased by increasing a temperature T of the cleaning solution to be higher than a normal temperature, and non-uniformity in line widths of a second-time resist pattern in a wafer surface can be decreased even if a processing time t is decreased.

Desirably, the temperature T of the cleaning solution may be higher than the normal temperature, more desirably, equal to or higher than about 30° C.

As described above, by increasing the temperature T of the cleaning solution to be higher than the normal temperature, the convergence time t1 can be further decreased. The reason for that may be considered as follows. By way of example, that is because solubility of a remaining developing solution dissolved by a cleaning solution is increased, and, thus, the developing solution can be removed from the surface of the wafer W in a relatively short time.

Further, by comparing FIG. 14 with FIG. 16, it can be seen that a convergence time t1 can be further decreased by increasing a flow rate F of the cleaning solution to be relatively high, and non-uniformity in line widths of a second-time resist pattern in a wafer surface can be decreased even if a processing time t is decreased.

As described above, by increasing the flow rate F of the cleaning solution to be relatively high, the convergence time t1 can be further decreased. The reason for that may be considered as follows. By way of example, that is because a remaining developing solution is mixed with a greater amount of the cleaning solution, and, thus, the developing solution can be removed from the surface of the wafer W in a relatively short time.

To be specific, when the temperature T of the cleaning solution is about 23° C. and the flow rate F of the cleaning solution is about 350 ml/min, the convergence time t1 is about 90 seconds, and when the temperature T of the cleaning solution is about 50° C. and the flow rate F of the cleaning solution is about 550 ml/min, the convergence time t1 is about 10 seconds. Thus, by increasing the temperature T of the cleaning solution to be higher than the normal temperature and increasing the flow rate F of the cleaning solution to be relatively high, the convergence time t1 can be relatively decreased.

In the cleaning process (step S16), it may be possible to use an acid cleaning solution having a pH of about 7 or less as a cleaning solution. If the acid cleaning solution having a pH of about 7 or less is used as the cleaning solution, an amount of a developing solution remaining on a surface of a wafer can be reduced in the cleaning process (step S16). By using the acid cleaning solution having the pH of about 7 or less, a convergence time t1 can be further decreased. The reason for that may be considered as follows. By way of example, that is because a remaining developing solution is neutralized by the acid cleaning solution, and, thus, the developing solution can be removed from the surface of the wafer W in a relatively short time.

As the acid cleaning solution, it may be possible to select at least one of inorganic acids and organic acids and to use the at least one as it is or the least one diluted with pure water or the like.

As the inorganic acids, it may be possible to use at least one of hydrochloric acid, nitric acid, phosphoric acid, sulphuric acid, boric acid, and hydrofluoric acid.

As the organic acids, it may be possible to use at least one of fatty acid (fatty carboxylic acid), aromatic carboxylic acid, and oxo carboxylic acid.

As the fatty acid (fatty carboxylic acid), it may be possible to use at least one of formic acid [methanoic acid], acetic acid [ethanoic acid], propionic acid [propanoic acid], butyric acid [butanoic acid], isobutyric acid, valeric acid (valerian acid) [pentanoic acid], isovaleric acid, caproic acid [hexanoic acid], enanthic acid (heptyl acid) [heptanoic acid], caprylic acid [octanoic acid], pelargonic acid [nonanoic acid], capric acid [decanoic acid], lauric acid [dodecanoic acid], myristic acid [tetradecanoic acid], pentadecylic acid [pentadecanoic acid], palmitic acid (cetanoic acid) [hexadecanoic acid], margaric acid [heptadecanoic acid], stearic acid [octadecanoic acid], oleic acid, linoleic acid, linolenic acid, tuberculostearic acid [nonadecanoic acid], arachidic acid [icosanoic acid], arachidonic acid, eicosapentaenoic acid, behenic acid [docosanoic acid], docosahexaenoic acid, lignoceric acid [tetracosanoic acid], cerotic acid [hexacosanoic acid], montanic acid [octacosanoic acid], and melissic acid [triacontanoic acid)].

As the aromatic carboxylic acid, it may be possible to use at least one of salicylic acid [hydroxybenzoic acid], gallic acid (trihydroxybenzoic acid), benzoic acid [benzene carboxylic acid], phthalic acid, cinnamic acid (β-phenylacrylic acid), and mellitic acid (mellit acid, graphitic acid) [benzene hexacarboxylic acid].

As the oxo carboxylic acid, it may be possible to use pyruvic acid (oxopropionic acid, α-ketopropionic acid and pyroracemic acid).

Further, as the organic acids, it may be possible to use other kinds of organic acids. As the other kinds of organic acids, it may be possible to use at least one of oxalic acid [ethanedioic acid], lactic acid (α-hydroxypropanoic acid), tartaric acid, maleic acid, fumaric acid (fumar acid allomaleic acid, boletic acid, lichenic acid), malonic acid [propanedioic acid], succinic acid, malic acid (hydroxysuccinic acid), citric acid, aconitic acid, glutaric acid, adipic acid [hexanedioic acid], amino acid, and L-ascorbic acid (vitamin C).

As described above, in accordance with the substrate processing method of the present embodiment, the first data are prepared and the processing time t for performing the cleaning process on the wafer W is determined based on the first data. Therefore, the processing time t may be determined such that the processing time t is substantially the same as the convergence time t1 when the line width CD2 of the second resist pattern P2 converges. Thus, it is possible to decrease non-uniformity in line widths of the second-time resist pattern in a wafer surface without increasing a processing time.

First Modification Example of First Embodiment

Hereinafter, referring to FIGS. 17 and 18, there will be explained a substrate processing method in accordance with a first modification example of the first embodiment.

A substrate processing method of the present modification example is different from the substrate processing method in accordance with the first embodiment in that a processing time t is determined based on a relationship between the processing time t and line widths CD2-1 and CD2-2 of a second resist pattern P2 on both a central area of a wafer W and a periphery area of the wafer W.

In this modification example, the substrate processing system, the developing unit, and the line width measurement apparatus explained in the first embodiment may be used.

Figure 17:
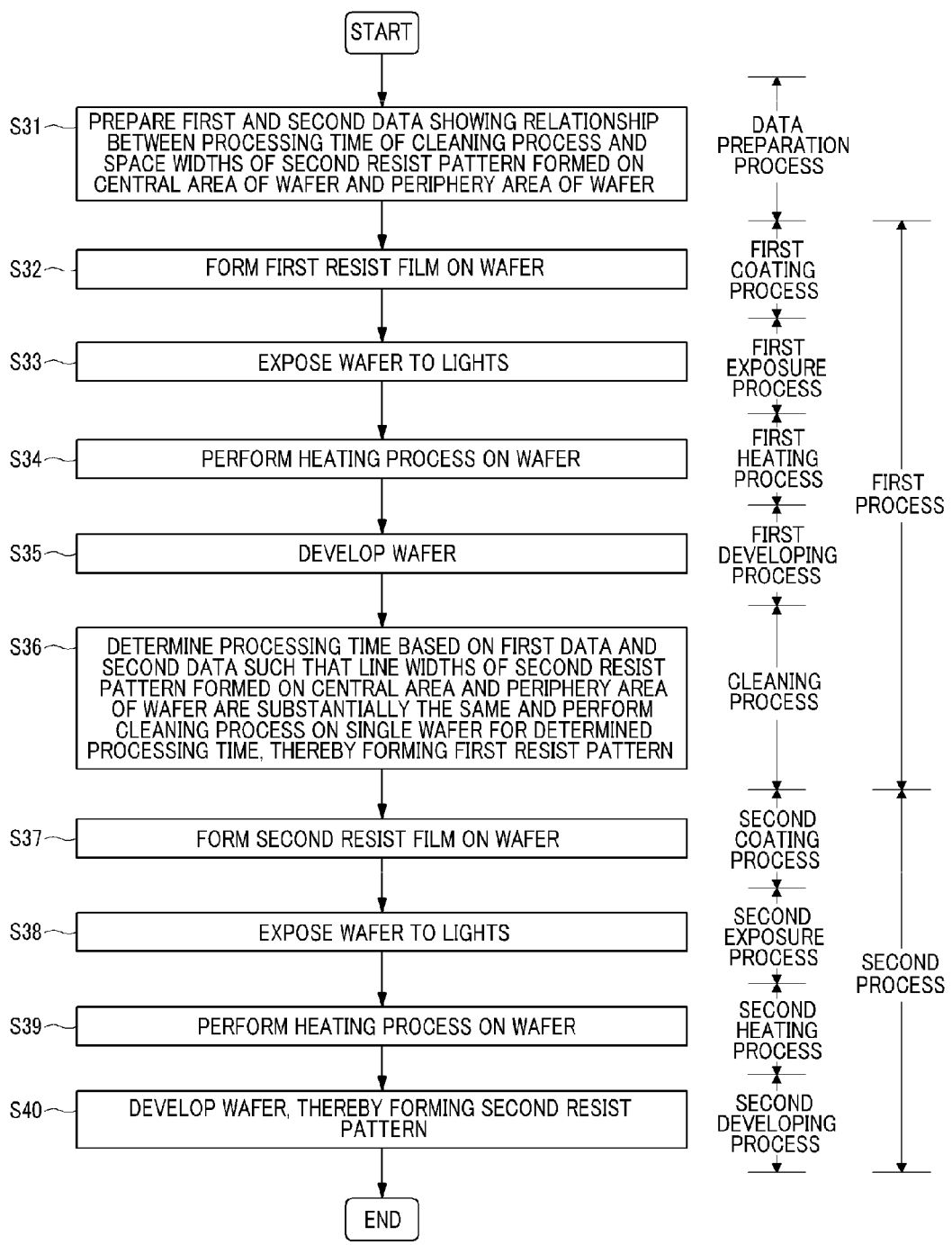
FIG. 17 is a flow chart for explaining a sequence of processes of a substrate processing method in accordance with a first modification example of the first embodiment.
Figure 18:
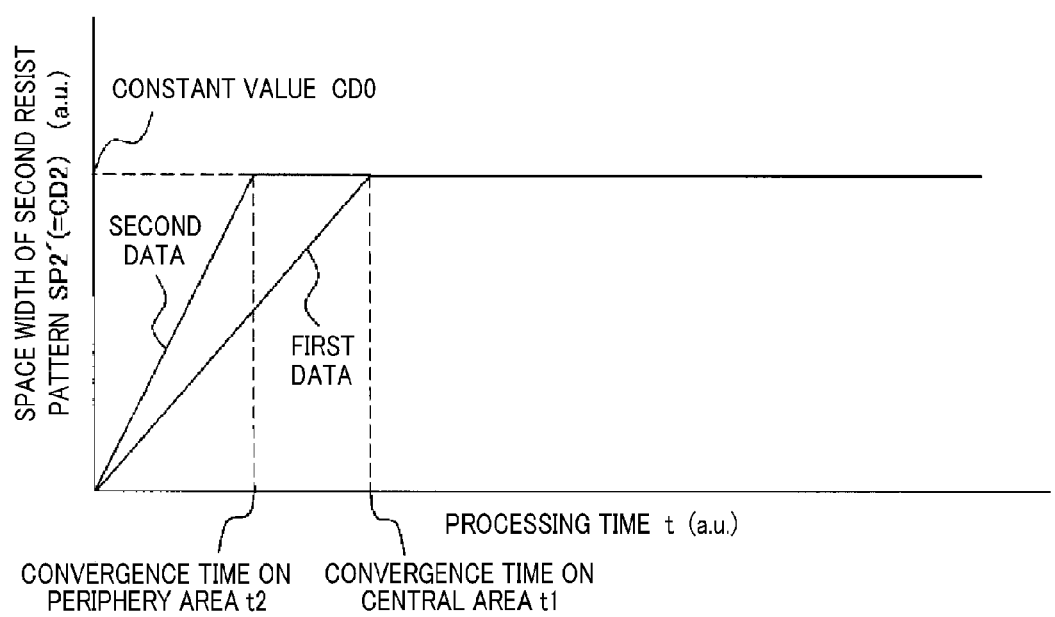
FIG. 18 is a graph schematically showing a relationship between a processing time and a space width of a second resist pattern.

FIG. 17 is a flow chart for explaining a sequence of processes of a substrate processing method in accordance with the present modification example. FIG. 18 is a graph schematically showing a relationship between a processing time and a space width of a second resist pattern.

As depicted in FIG. 17, the substrate processing method in accordance with the present modification example includes a data preparation process (step S31), a first process (step S32 to step S36), and a second process (step S37 to step S40). The first process (step S32 to step S36) includes a first coating process (step 32), a first exposure process (step S33), a first heating process (step S34), a first developing process (step S35), and a cleaning process (step S36). The second process (step S37 to step S40) includes a second coating process (step S37), a second exposure process (step S38), a second heating process (step S39), and a second developing process (step S40).

First of all, the data preparation process (step S31) is performed. In the data preparation process (step S31), first and second data showing a relationship between a processing time t for performing a cleaning process on the wafer W in the cleaning process (step S36) and space widths SP2' of a second resist pattern P2 formed on a central area of the wafer W and a periphery area of the wafer W.

The first coating process (step S32) to the first developing process (step S35) are performed on each wafer W of a wafer set including multiple wafers W. Then, the cleaning process (step S36) is performed while the processing time t is varied for each wafer W. Thereafter, by performing the second coating process (step S37) to the second developing process (step S40) to be described later, a first resist pattern P1 and a second resist pattern P2 are formed on the wafer W as described in the first embodiment with reference to FIGS. 10A to 10J. Subsequently, the space widths SP2'-1 and SP2'-2 of the second resist pattern P2 formed on the central area of the wafer W and the periphery area of the wafer W are measured by the line width measurement apparatus 110. In this way, the first data and the second data showing a relationship between the processing time t and the space widths SP2'-1 and SP2'-2 of the second resist pattern P2 formed on the central area of the wafer W and the periphery area of the wafer W are prepared.

Further, the space widths SP2'-1 and SP2'-2 of the second resist pattern P2 correspond to the line widths of the second resist pattern of the present disclosure.

Then, the first process (step S32 to step S36) is performed on a single wafer W. Each of the first coating process (step S32) to the first developing process (step S35) is the same as each of the first coating process (step S12) to the first developing process (step S15). Further, the cleaning process (step S36) is the same as the first cleaning process (step S16) of the first embodiment except that the processing time t is determined based on the first data and the second data. Furthermore, a method of determining the processing time t in the cleaning process (step S36) will be explained later.

Thereafter, the second process (step S37 to step S40) is performed on the single wafer W. The second process (step S37 to step S40) is the same as the second process (step S17 to step S20) of the first embodiment.

Hereinafter, a method of determining the processing time t in the cleaning process (step S36) will be explained.

As explained in the first embodiment, as the processing time t is increased within a short processing time range, the space width SP2' (CD2) of the second resist pattern P2 is changed, and finally saturated to a constant value CD0 after a certain time.

However, a supply speed of the cleaning solution in the cleaning process is different between the central area of the wafer W and the periphery area of the wafer W, and, thus, the space widths SP2' (CD2) converges to the constant value CD0 at different times. In the present modification example, in the same manner as the first embodiment, while the cleaning solution is supplied, a gas is supplied toward the periphery area of the wafer W at a downstream position of a supply position of the cleaning solution in a rotation direction of the wafer W. Therefore, the space width SP2' (CD2) on the periphery area of the wafer W converges to the constant value CD0 in a shorter time than the space width SP2' (CD2) on the central area of the wafer W. That is, as depicted in FIG. 18, the space width SP2' (CD2) on the central area of the wafer W converges to the constant value CD0 after a convergence time t1 and the space width SP2' (CD2) on the periphery area of the wafer W converges to the constant value CD0 after a convergence time t2 (<t1).

If the processing time t is shorter than the convergence time t2, the line widths CD2 of the second resist pattern P2 on both the central area and the periphery area of the wafer W cannot be the constant value CD0 and non-uniformity in the line width CD2 cannot be decreased between wafers or in a single wafer surface.

Meanwhile, if the processing time t is longer than the convergence time t2 on the periphery area and shorter than the convergence time t1 on the central area, the line width CD2 on the periphery area of the wafer W can be the constant value CD0 and non-uniformity in the line width CD2 can be decreased between wafers or in a single wafer surface. However, the line width CD2 of the second resist pattern P2 on the central area of the wafer W cannot be the constant value CD0 and non-uniformity in the line width CD2 cannot be decreased between wafers or in a single wafer surface.

If the processing time t is longer than the convergence time t1, the line widths CD2 on both the central area of the wafer W and the periphery area of the wafer W can be the constant value CD0 and non-uniformity in the line width CD2 can be decreased between wafers or within a surface of the single wafer.

Therefore, the first data (convergence time t1) and the second data (convergence time t2) are prepared and the processing time t is determined to be substantially the same as any longer one of the convergence time t1 and the convergence time 2, so that non-uniformity in a line width CD2-1 (space width SP2'-1) and a line width CD2-2 (space width SP2'-2) within a surface of the single wafer can be decreased without increasing the processing time t.

In the present modification example, there has been explained a case where a wafer is divided into two areas including a central area and a periphery area of the wafer; data showing a relationship between the processing time t and the line widths of the second resist pattern for each area are prepared; and the processing time t is determined based on the data. However, the number of the divided areas of the wafer is not limited to two, but the wafer may be divided into three or more areas; data showing a relationship between the processing time t and the line widths of the second resist pattern for each of the areas are prepared; and the processing time t may be determined based on the data. Thus, non-uniformity in the line widths of the second resist pattern can be further decreased between wafers and in a surface of the single wafer.

Second Modification Example of First Embodiment

Hereinafter, referring to FIGS. 19 to 22, there will be explained a substrate processing method in accordance with a second modification example of the first embodiment.

The substrate processing method in accordance with the present modification example is different from the substrate processing method of the first embodiment in that first data include a first processing condition under which a cleaning process is performed on the wafer W in the first process and the first data show a relationship between a condition other than a processing time and a line width CD2 of a second resist pattern P2.

In the present modification example, the substrate processing system, the developing unit, and the line width measurement apparatus explained in the first embodiment may be used.

Figure 19:
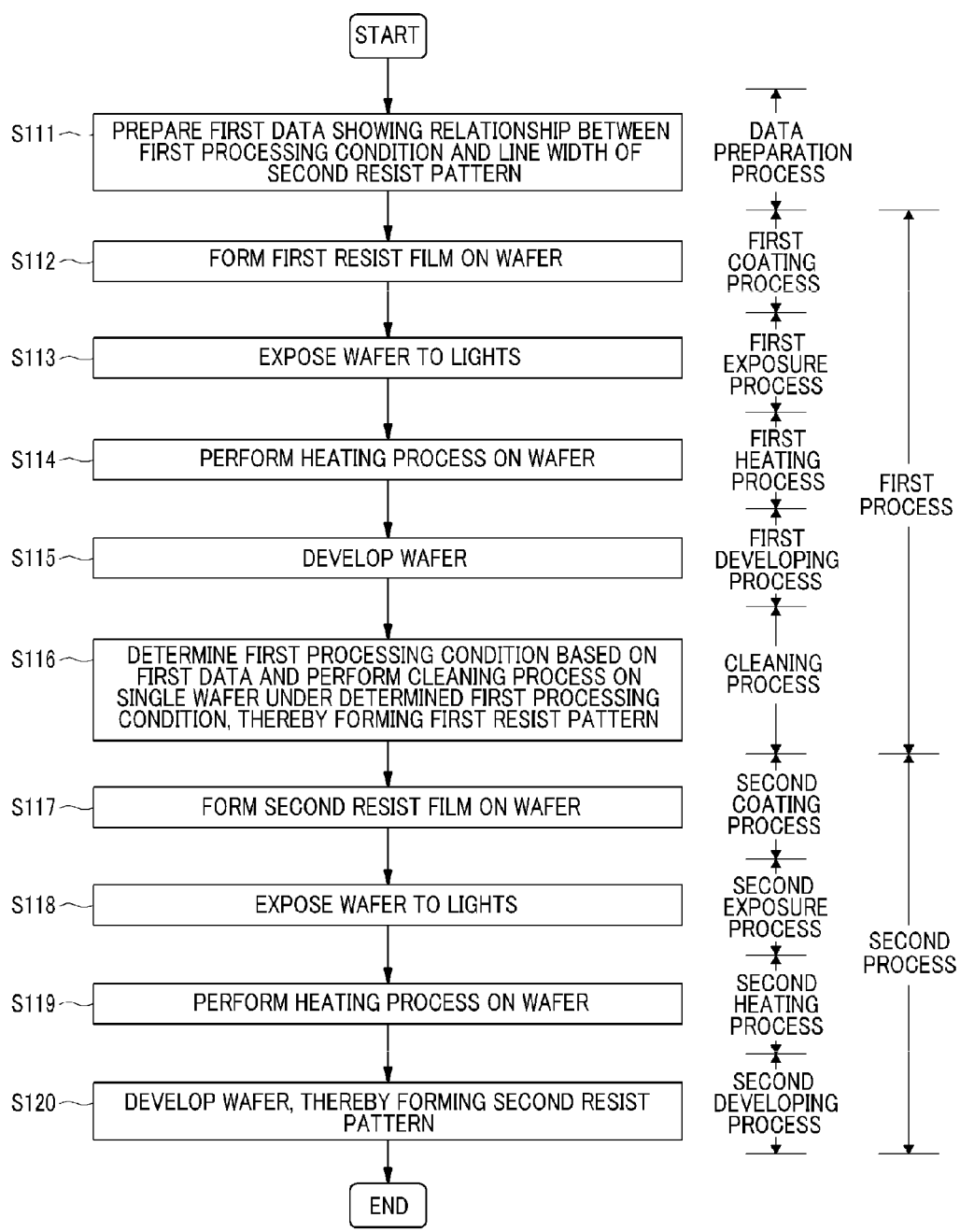
FIG. 19 is a flow chart for explaining a sequence of processes of a substrate processing method in accordance with a second modification example of the first embodiment.

FIG. 19 is a flow chart for explaining a sequence of processes of the substrate processing method in accordance with the present modification example.

As depicted in FIG. 19, the substrate processing method in accordance with the present modification example includes a data preparation process (step S111) to a second developing process (step S120). Each of a first coating process (step S112) to a first developing process (step S115) is the same as each of the first coating process (step S12) to the first developing process (step S15) explained with reference to FIG. 9, and, thus, explanation thereof will be omitted. Further, each of a second coating process (step S117) to the second developing process (step S120) is the same as each of the second coating process (step S17) to the second developing process (step S20) explained with reference to FIG. 9, and, thus, explanation thereof will be omitted.

First of all, in the data preparation process (step S111), first data showing a relationship between a first processing condition under which a cleaning process is performed on the wafer W in the cleaning process (step S116) and a space width SP2' of a second resist pattern P2 are prepared.

The first coating process (step S112) to the first developing process (step S115) are performed on each wafer W of a wafer set including multiple wafers W. Then, the cleaning process (step S116) is performed while the first processing condition is modified for each wafer W. Thereafter, by performing the second coating process (step S117) to the second developing process (step S120), a first resist pattern P1 and a second resist pattern P2 are formed on the wafer W as described in the first embodiment with reference to FIGS. 10A to 10J. Subsequently, the space width SP2' of the second resist pattern P2 formed on the wafer W is measured by the line width measurement apparatus 110. In this way, the first data showing the relationship between the first processing condition and the space width SP2' of the second resist pattern P2 are prepared.

Then, the first process (step S112 to step S116) is performed on a single wafer W. Each of the first coating process (step S112) to the first developing process (step S115) is the same as each of the first coating process (step S12) to the first developing process (step S15). Further, the cleaning process (step S116) is the same as the first cleaning process (step S16) of the first embodiment except that the first processing condition is determined based on the first data.

Thereafter, the second process (step S117 to step S120) is performed on the single wafer W. The second process (step S117 to step S120) is the same as the second process (step S17 to step S20) of the first embodiment.

Hereinafter, some examples of the first processing condition and a method of determining the first processing condition in the cleaning process (step S116) will be explained.

A first example of the first processing condition may be a temperature T of a cleaning solution. When the temperature T of the cleaning solution is lower than a first temperature T1, the space width SP2' of the second resist pattern P2 varies depending on the temperature T of the cleaning solution. If the temperature T of the cleaning solution is equal to or higher than the first temperature T1, the space width SP2' of the second resist pattern P2 converges to a constant value. In this case, the first data may include the first temperature T1. Further, in the cleaning process (step S116), the temperature T of the cleaning solution is determined to be substantially the same as the first temperature T1 based on the first data.

Figure 20:
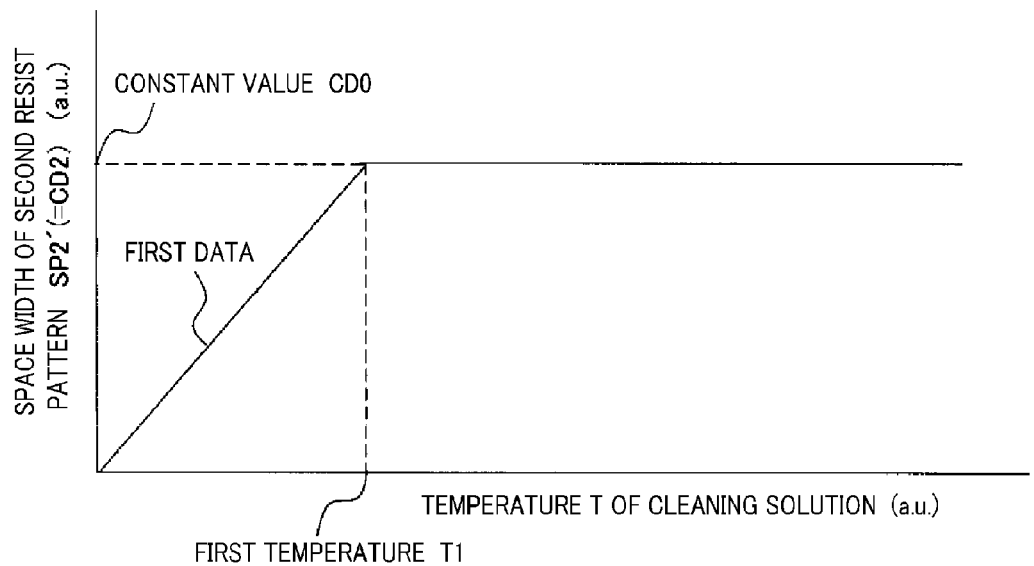
FIG. 20 is a graph schematically showing a relationship between a temperature of a cleaning solution and a space width of a second resist pattern.

FIG. 20 is a graph schematically showing a relationship between a temperature of a cleaning solution and a space width of a second resist pattern.

In the cleaning process (step S116), when the temperature T of the cleaning solution is lower than the first temperature T1, the space width SP2' of the second resist pattern P2 after the second heating process (step S119) is decreased as the temperature T of the cleaning solution is lowered. That is because, by way of example, a developing solution supplied to the wafer W is not removed sufficiently and the developing solution such as an alkaline solvent remains on a surface of the wafer W in the first developing process (step S115).

Further, in a case where the temperature T of the cleaning solution is equal to or higher than the first temperature T1 in the cleaning process (step S116), even if the temperature T of the cleaning solution is further increased, the space width SP2' of the second resist pattern P2 is not changed. That is because, by way of example, the developing solution supplied to the wafer W is approximately completely removed and the developing solution does not remain on the surface of the wafer W in the first developing process (step S115).

As described above, that is because, by way of example, as the temperature T of the cleaning solution is increased, solubility of a remaining developing solution dissolved by the cleaning solution is increased, and, thus, the developing solution can be removed sufficiently from the surface of the wafer W.

As depicted in FIG. 20, when the temperature T of the cleaning solution is lower than the first temperature T1, the space width SP2' (CD2) is increased as the temperature T of the cleaning solution is increased and converges to a constant value CD0 at the first temperature T1. Further, when the temperature T of the cleaning solution becomes equal to or higher than the first temperature T1, the line width CD2 of the second resist pattern P2 can be the constant value CD0 and non-uniformity in the line width CD2 may be decreased between wafers W or in the surface of the single wafer.

A second example of the first processing condition may be a flow rate F of the cleaning solution. If the flow rate F of the cleaning solution is lower than a first flow rate F1, the space width SP2' of the second resist pattern P2 varies depending on the flow rate F of the cleaning solution. If the flow rate F of the cleaning solution is equal to or higher than the first flow rate F1, the space width SP2' of the second resist pattern P2 converges to a constant value. In this case, the first data may include the first flow rate F1. Further, in the cleaning process (step S116), the flow rate F of the cleaning solution is determined to be substantially the same as the first flow rate F1 based on the first data.

Figure 21:
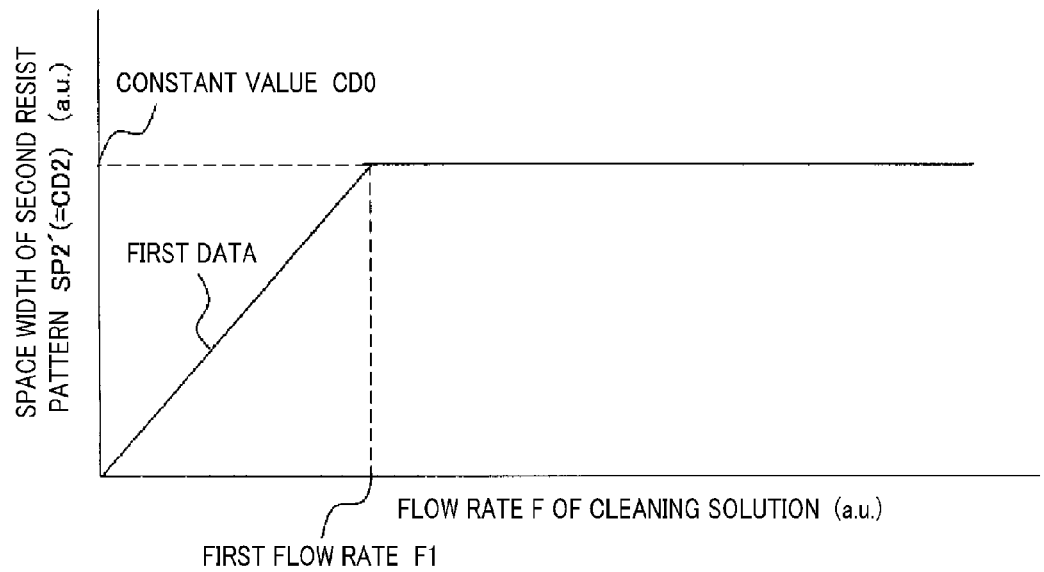
FIG. 21 is a graph schematically showing a relationship between a flow rate of a cleaning solution and a space width of a second resist pattern.

FIG. 21 is a graph schematically showing a relationship between a flow rate of a cleaning solution and a space width of a second resist pattern.

In the cleaning process (step S116), if the flow rate F of the cleaning solution is lower than the first flow rate F1, the space width SP2' of the second resist pattern P2 after the second heating process (step S119) is decreased as the flow rate F of the cleaning solution is lowered. That is because, by way of example, a developing solution supplied to the wafer W is not removed sufficiently and the developing solution as an alkaline solvent remains on the surface of the wafer W in the first developing process (step S115).

Further, in a case where the flow rate F of the cleaning solution is equal to or higher than the first flow rate F1 in the cleaning process (step S116), even if the flow rate F of the cleaning solution is further increased, the space width SP2' of the second resist pattern P2 is not changed. That is because, by way of example, the developing solution supplied to the wafer W is approximately completely removed and the developing solution does not remain on the surface of the wafer W in the first developing process (step S115).

As described above, that is because, by way of example, as the flow rate F of the cleaning solution is increased, a remaining developing solution is mixed with a greater amount of the cleaning solution, and, thus, the developing solution can be removed sufficiently from the surface of the wafer W. Further, that is because a part of the insoluble areas 135b is changed into the soluble areas 135a in the second heating process (step S119) without prevention by remaining components of the developing solution.

As depicted in FIG. 21, if the flow rate F of the cleaning solution is lower than the first flow rate F1, the space width SP2' (CD2) is increased as the flow rate F of the cleaning solution is increased and converges to a constant value CD0 at the first flow rate F1. Further, if the flow rate F of the cleaning solution becomes equal to or higher than the first flow rate F1, the line width CD2 of the second resist pattern P2 can be the constant value CD0 and non-uniformity in the line width CD2 may be decreased between wafers W or in a single wafer surface.

A third example of the first processing condition may be a pH of the cleaning solution. If the pH of the cleaning solution is higher than a first pH, the space width SP2' of the second resist pattern P2 varies depending on the pH of the cleaning solution. If the pH of the cleaning solution is equal to or lower than the first pH, the space width SP2' of the second resist pattern P2 converges to a constant value. In this case, the first data may include the first pH. Further, in the cleaning process (step S116), the pH of the cleaning solution is determined to be substantially the same as the first pH based on the first data.

Figure 22:
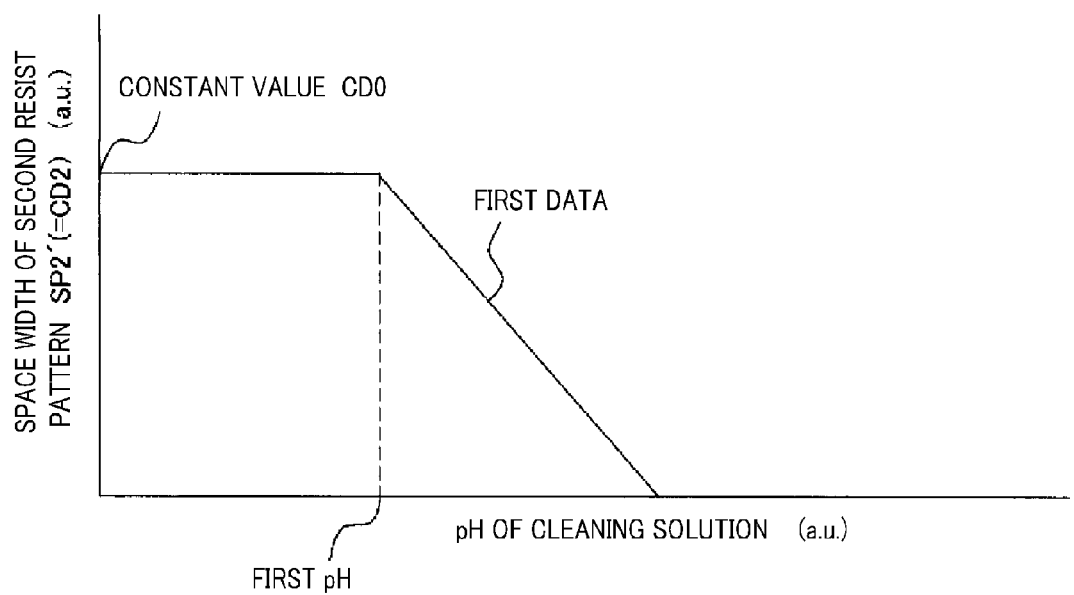
FIG. 22 is a graph schematically showing a relationship between pH of a cleaning solution and a space width of a second resist pattern.

FIG. 22 is a graph schematically showing a relationship between a pH of a cleaning solution and a space width of a second resist pattern.

In the cleaning process (step S116), if the pH of the cleaning solution is higher than the first pH, the space width SP2' of the second resist pattern P2 after the second heating process (step S119) is decreased as the pH of the cleaning solution is increased. That is because, by way of example, a developing solution supplied to the wafer W is not removed sufficiently and the developing solution as an alkaline solvent remains on a surface of the wafer W in the first developing process (step S115).

Further, in a case where the pH of the cleaning solution is equal to or lower than the first pH in the cleaning process (step S116), even if the pH of the cleaning solution is further decreased, the space width SP2' of the second resist pattern P2 is not changed. That is because, by way of example, the developing solution supplied to the wafer W is approximately completely removed and the developing solution does not remain on the surface of the wafer W in the first developing process (step S115).

As described above, that is because, by way of example, as the pH of the cleaning solution is decreased, a remaining developing solution is neutralized by a cleaning solution having stronger acidity, and, thus, the developing solution can be removed sufficiently from the surface of the wafer W.

As depicted in FIG. 22, if the pH of the cleaning solution is higher than the first pH, the space width SP2' (CD2) is increased as the pH of the cleaning solution is increased and converges to a constant value CD0 at the first pH. Further, if the pH of the cleaning solution becomes equal to or lower than the first pH, the line width CD2 of the second resist pattern P2 can be the constant value CD0 and non-uniformity in the line width CD2 may be decreased between wafers W or in a single wafer surface.

By way of example, as an acid cleaning solution having a pH of about 7 or less, it may be possible to use at least one of acids mentioned in the first embodiment as it is or at least one of acids diluted with water or the like.

In accordance with the present modification example, even if a processing time cannot be further reduced due to other limitations on a substrate processing, the line width CD2 of the second resist pattern P2 can be the constant value CD0 by controlling the temperature T, flow rate F, and pH of the cleaning solution and non-uniformity in the line widths CD2 may be decreased between wafers W and in a single wafer surface.

Further, also in the present modification example, the first processing condition may be determined based on a relationship between the first processing condition and the line widths CD2-1 and CD2-2 of the second resist pattern on the central area of the wafer W and the periphery area of the wafer W, respectively as described in the first modification example of the first embodiment. Thus, non-uniformity in the line width CD2-1 (space width SP2'-1) and the line width CD2-2 (space width SP2'-2) on the central area of the wafer W and the periphery area of the wafer W, respectively, can be decreased.

Third Modification Example of First Embodiment

Hereinafter, referring to FIGS. 23 to 26, there will be explained a substrate processing method in accordance with a third modification example of the first embodiment.

The substrate processing method in accordance with the present modification example is different from the substrate processing method of the first embodiment in that first data show a relationship between a processing time t, a second processing condition under which a cleaning process is performed on the wafer W in a first cleaning process and a line width CD2 of a second resist pattern P2.

Also in the present modification example, the substrate processing system, the developing unit, and the line width measurement apparatus explained in the first embodiment may be used.

Figure 23:
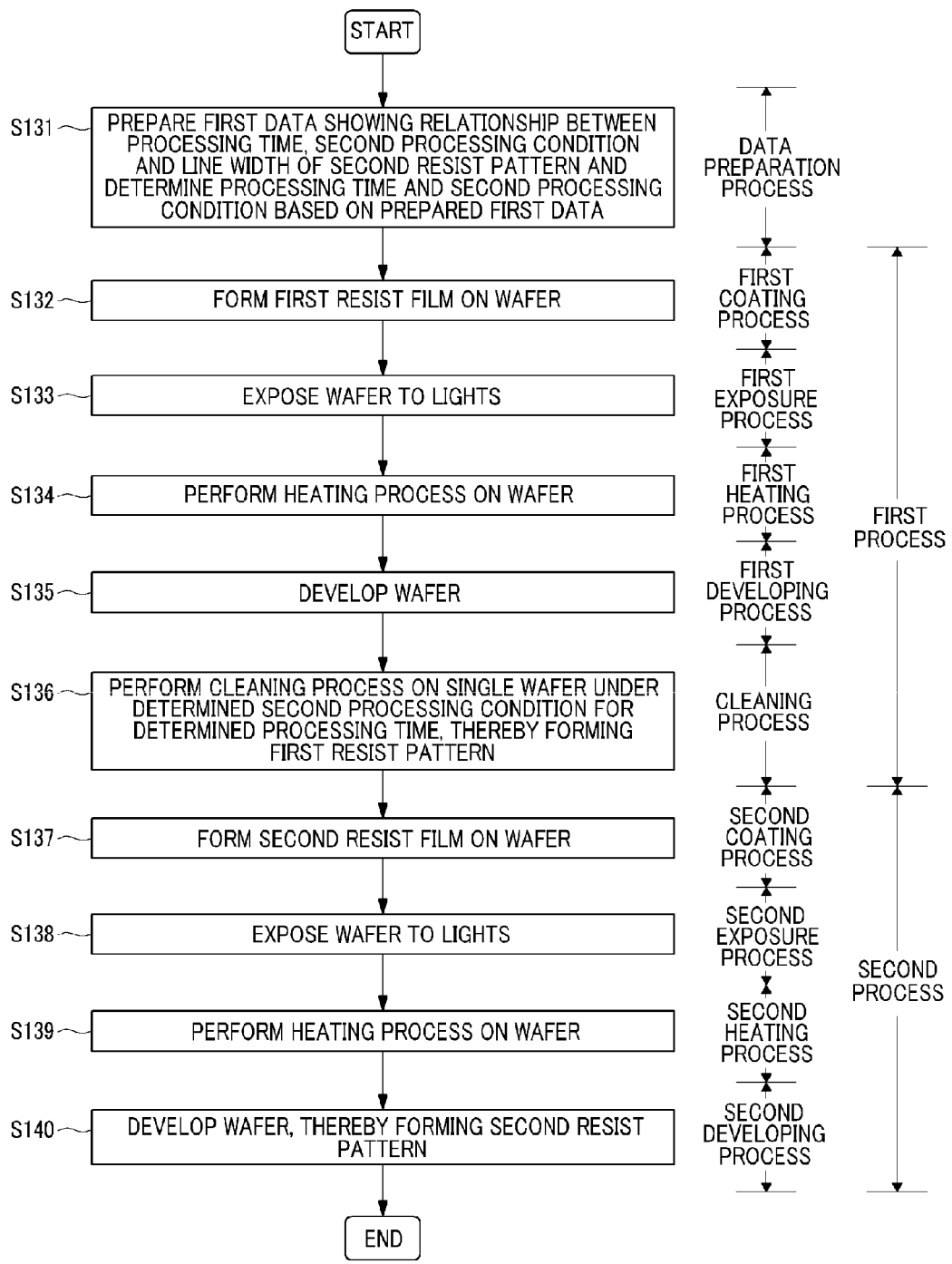
FIG. 23 is a flow chart for explaining a sequence of processes of a substrate processing method in accordance with a third modification example of the first embodiment.

FIG. 23 is a flow chart for explaining a sequence of processes of the substrate processing method in accordance with the present modification example.

As depicted in FIG. 23, the substrate processing method in accordance with the present modification example includes a data preparation process (step S131) to a second developing process (step S140). Each of a first coating process (step S132) to a first developing process (step S135) is the same as each of the first coating process (step S12) to the first developing process (step S15) explained with reference to FIG. 9, and, thus, explanation thereof will be omitted. Further, each of a second coating process (step S137) to the second developing process (step S140) is the same as each of the second coating process (step S17) to the second developing process (step S20) explained with reference to FIG. 9, and, thus, explanation thereof will be omitted.

First of all, in the data preparation process (step S131), first data showing a relationship between a processing time t, a second processing condition under which a cleaning process is performed on the wafer W in a cleaning process (step S136) and a space width SP2' of a second resist pattern P2 are prepared. The processing time t and the second condition is determined based the prepared first data.

The first coating process (step S132) to the first developing process (step S135) are performed on each wafer W of a wafer set including multiple wafers W. Then, the cleaning process (step S136) is performed while the processing time t and the second processing condition are modified for each wafer W. Thereafter, by performing the second coating process (step S137) to the second developing process (step S140), a first resist pattern P1 and a second resist pattern P2 are formed on the wafer W as described in the first embodiment with reference to FIGS. 10A to 10J. Subsequently, the space width SP2' of the second resist pattern P2 is measured by the line width measurement apparatus 110. In this way, the first data showing the relationship between the processing time t, the second processing condition and the space width SP2' of the second resist pattern P2 are prepared.

Then, the first process (step S132 to step S136) is performed on a single wafer W. Each of the first coating process (step S132) to the first developing process (step S135) is the same as each of the first coating process (step S12) to the first developing process (step S15). Further, the cleaning process (step S136) is the same as the first cleaning process (step S16) of the first embodiment except that the cleaning process (step S136) adopts the processing time t and the second processing condition under which the cleaning process is performed on the single wafer.

Thereafter, the second process (step S137 to step S140) is performed on the single wafer W. The second process (step S137 to step S140) is the same as the second process (step S17 to step S20) of the first embodiment.

Hereinafter, a method of determining the processing time t and the second processing condition in the data preparation process (step S131) will be explained.

In the data preparation process (step S131), a method of changing the processing time t and the second processing condition for each wafer W is not limited.

By way of example, when the data preparation process (step S131) is first performed, there are prepared the first data corresponding to matrix condition data in which the processing time t and the second processing conditions are varied, and the processing time t and the second processing condition may be determined based on the prepared first data.

Further, for each of multiple different second processing conditions, a convergence time t1 when the space width SP2' of the second resist pattern P2 converges may be obtained. In this case, the first data may include the multiple different second processing conditions and the convergence time t1 corresponding to each of the second processing conditions.

Alternatively, the processing time t is fixed to a first processing time t11. In such a state the second processing condition may be optimized to an optimum value such that the space width SP2' of the second resist pattern P2 converges to the constant value. Further, in a state that the second processing condition is optimized to the optimum value, the convergence time t1 when the space width SP2' of the second resist pattern P2 converges to the constant value may be obtained. In this case, the first data may include the optimum value of the second processing condition and the convergence time t1. There will be explained a case where the first data include the optimum value of the second processing condition and the convergence time t1 after explanation of examples of the second processing condition.

A first example of the second processing condition may be a temperature T of a cleaning solution. In case that the processing time t is set to be the first processing time t11, if the temperature T of the cleaning solution is lower than a first temperature T1, the space width SP2' of the second resist pattern P2 varies depending on the temperature T of the cleaning solution. If the temperature T of the cleaning solution is equal to or higher than the first temperature T1, the space width SP2' of the second resist pattern P2 converges to a constant value. In this case, the first data may include the first temperature T1. In addition, when the temperature T of the cleaning solution is the first temperature T1, the first data includes the convergence time t1 when the space width SP2' of the second resist pattern P2 converges to the constant value.

Further, in the data preparation process (step S131), the temperature T of the cleaning solution is determined to be substantially the same as the first temperature T1 based on the first data, and the processing time t is determined to be substantially the same as the convergence time t1.

Figure 24:
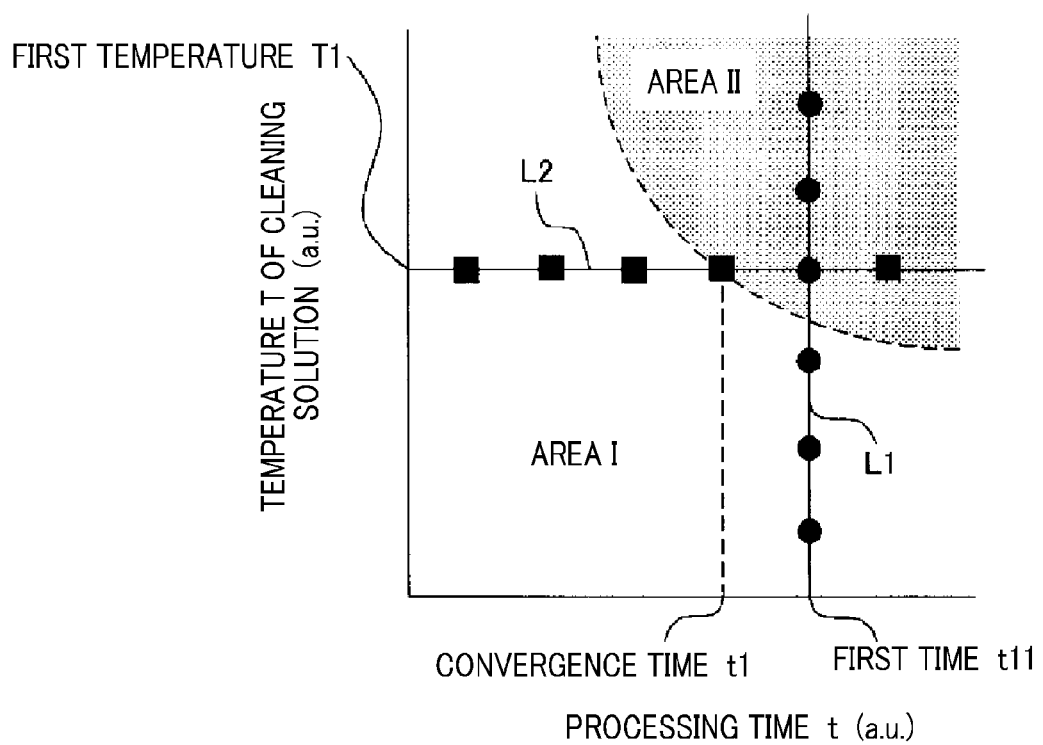
FIG. 24 is a graph schematically showing a relationship between a processing time, a temperature of a cleaning solution and a space width of a second resist pattern.

FIG. 24 is a graph schematically showing a relationship between a processing time, a temperature of a cleaning solution and a space width of a second resist pattern.

As depicted in FIG. 24, a horizontal axis represents a processing time t and a vertical axis represents a temperature T of the cleaning solution. In an area I where the processing time t is short and the temperature T of the cleaning solution is low, as the processing time t is decreased or the temperature T of the cleaning solution is decreased, the space width SP2' of the second resist pattern P2 becomes narrower. Meanwhile, in an area II where the processing time t is long and the temperature T of the cleaning solution is high, even if the processing time t is increased or the temperature T of the cleaning solution is increased, the space width SP2' of the second resist pattern P2 is not changed and converges to a constant value CD0. That is, the space width SP2' of the second resist pattern P2 becomes uniform in the area II.

Therefore, if the processing time t is the first time t11 (on a line L1), and if the temperature T of the cleaning solution is lower than the first temperature T1, the space width SP2' of the second resist pattern P2 varies depending on the temperature T of the cleaning solution. If the temperature T of the cleaning solution is equal to or higher than the first temperature T1, the space width SP2' of the second resist pattern P2 converges to a constant value. The first temperature T1 in this case is obtained. Then, if the temperature T of the cleaning solution is the first temperature T1 (on a line L2), the convergence time t1 when the space width SP2' of the second resist pattern P2 converges to a constant value is obtained.

Consequently, the space width SP2' (CD2) of the second resist pattern P2 can be the constant value CD0, and non-uniformity in the line widths CD2 may be decreased between wafers W or in a single wafer surface. Further, by varying the temperature T of the cleaning solution, the convergence time t1 can be further decreased.

A second example of the second processing condition may be a flow rate F of a cleaning solution. If the processing time t is set to be the first processing time t11, if the flow rate F of the cleaning solution is lower than a first flow rate F1, the space width SP2' of the second resist pattern P2 varies depending on the flow rate F of the cleaning solution. If the flow rate F of the cleaning solution is equal to or higher than the first flow rate F1, the space width SP2' of the second resist pattern P2 converges to a constant value. In this case, the first data may include the first flow rate F1. Further, when the flow rate F of the cleaning solution is the first flow rate F1, the first data may include the convergence time t1 when the space width SP2' of the second resist pattern P2 converges to the constant value. Furthermore, in the data preparation process (step S131), the flow rate F of the cleaning solution is determined to be substantially the same as the first flow rate F1 based on the first data, and the processing time t is determined to be substantially the same as the convergence time t1.

Figure 25:
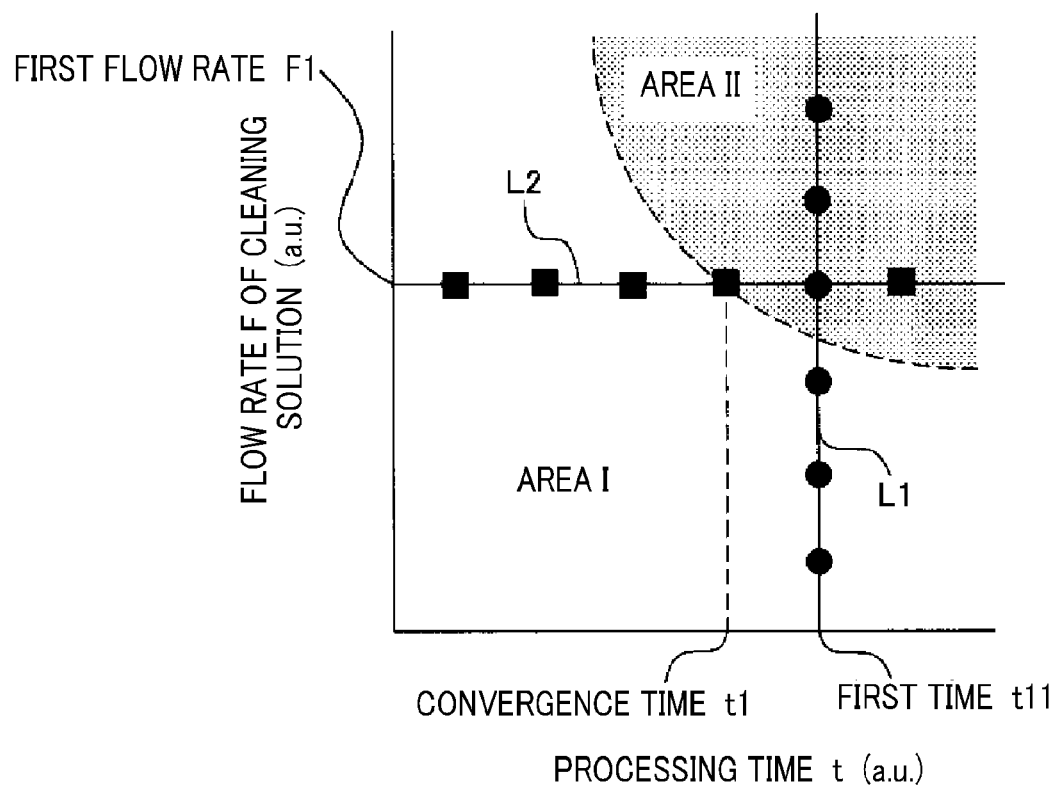
FIG. 25 is a graph schematically showing a relationship between a processing time, a flow rate of a cleaning solution and a space width of a second resist pattern.

FIG. 25 is a graph schematically showing a relationship between a processing time, a flow rate of a cleaning solution and a space width of a second resist pattern.

As depicted in FIG. 25, a horizontal axis represents a processing time t and a vertical axis represents a flow rate F of the cleaning solution. In an area I where the processing time t is short and the flow rate F of the cleaning solution is low, as the processing time t is decreased or the flow rate F of the cleaning solution becomes decreased, the space width SP2' of the second resist pattern P2 is narrower. Meanwhile, in an area II where the processing time t is long and the flow rate F of the cleaning solution is high, even if the processing time t is increased or the flow rate F of the cleaning solution is increased, the space width SP2' of the second resist pattern P2 is not changed and converges to a constant value CD0. That is, the space width SP2' of the second resist pattern P2 becomes uniform in the area II.

Therefore, if the processing time t is the first time t11 (on a line L1), and if the flow rate F of the cleaning solution is lower than the first flow rate F1, the space width SP2' of the second resist pattern P2 varies depending on the flow rate F of the cleaning solution. If the flow rate F of the cleaning solution is equal to or higher than the first flow rate F1, the space width SP2' of the second resist pattern P2 converges to a constant value. The first flow rate F1 in this case is obtained. Then, if the flow rate F of the cleaning solution is the first flow rate F1 (on a line L2), the convergence time t1 when the space width SP2' of the second resist pattern P2 converges to a constant value is obtained.

Consequently, the space width SP2' (CD2) of the second resist pattern P2 can be the constant value CD0, and non-uniformity in the line widths CD2 may be decreased between wafers W or in a wafer surface. Further, by varying the flow rate F of the cleaning solution, the convergence time t1 can be further decreased.

A third example of the second processing condition may be a pH of a cleaning solution. In case that the processing time t is set to be the first processing time t11, if the pH of the cleaning solution is higher than a first pH, the space width SP2' of the second resist pattern P2 varies depending on the pH of the cleaning solution. If the pH of the cleaning solution is equal to or lower than the first pH, the space width SP2' of the second resist pattern P2 converges to a constant value. In this case, the first data may include the first pH. Further, when the pH of the cleaning solution is the first pH, the first data may include the convergence time t1 when the space width SP2' of the second resist pattern P2 converges to the constant value. Furthermore, in the data preparation process (step S131), the pH of the cleaning solution is determined to be substantially the same as the first pH based on the first data, and the processing time t is determined to be substantially the same as the convergence time t1.

If the first pH is, for example, about 7 and if the processing time t is set to be the first time t11, when a pH of the cleaning solution is higher than the first pH, i.e., alkaline, the space width SP2' of the second resist pattern P2 varies depending on the pH of the cleaning solution. Further, when a pH of the cleaning solution is equal to or lower than the first pH, i.e., acid, the space width SP2' of the second resist pattern P2 converges to a constant value.

Figure 26:
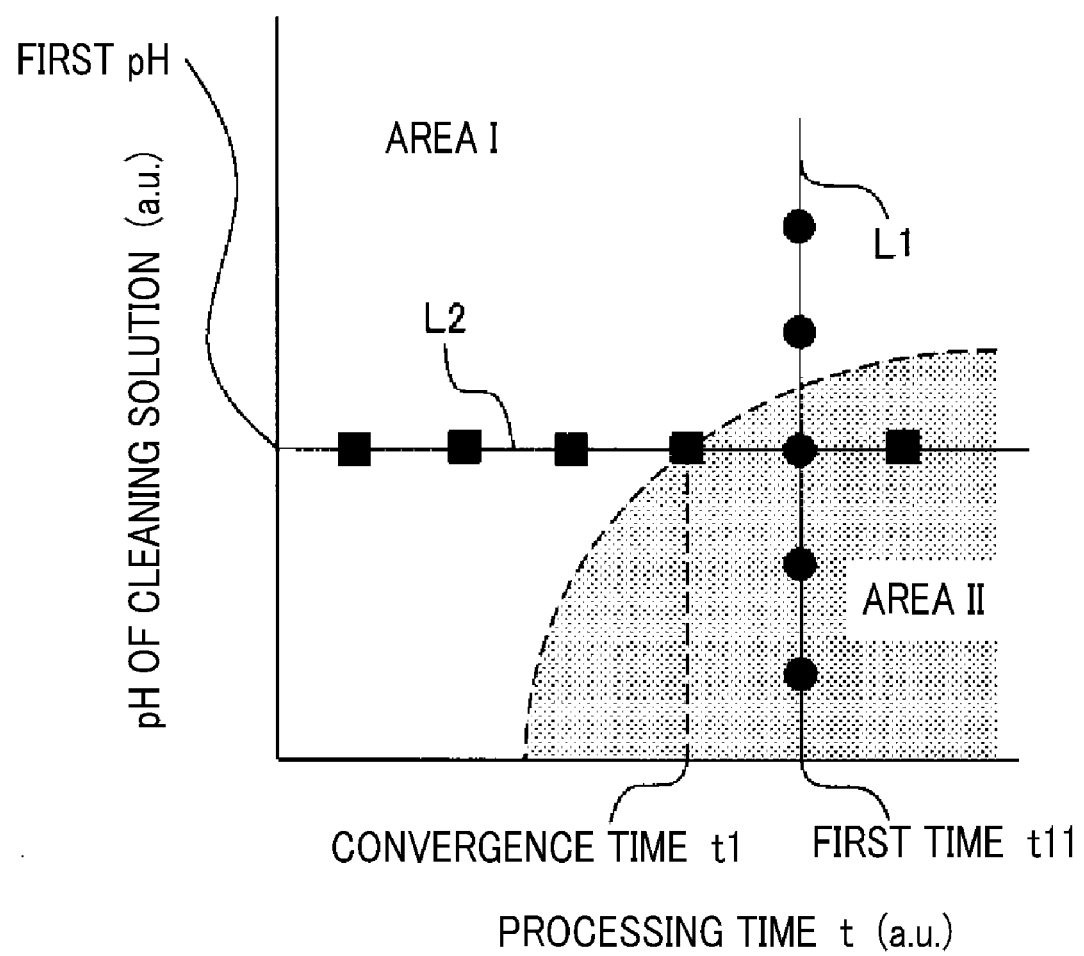
FIG. 26 is a graph schematically showing a relationship between a processing time, pH of a cleaning solution and a space width of a second resist pattern.

FIG. 26 is a graph schematically showing a relationship between a processing time, a pH of a cleaning solution and a space width of a second resist pattern.

As depicted in FIG. 26, a horizontal axis represents a processing time t and a vertical axis represents a pH of the cleaning solution. In an area I where the processing time t is short and the pH of the cleaning solution is high, as the processing time t is decreased or the pH of the cleaning solution is increased, the space width SP2' of the second resist pattern P2 becomes narrower. Meanwhile, in an area II where the processing time t is long and the pH of the cleaning solution is low, even if the processing time t is increased or the pH of the cleaning solution is decreased, the space width SP2' of the second resist pattern P2 is not changed and converges to a constant value CD0. That is, the space width SP2' of the second resist pattern P2 becomes uniform in the area II.

Therefore, if the processing time t is the first time t11 (on a line L1), and if the pH of the cleaning solution is higher than the first pH, the space width SP2' of the second resist pattern P2 varies depending on the pH of the cleaning solution. If the pH of the cleaning solution is equal to or lower than the first pH, the space width SP2' of the second resist pattern P2 converges to a constant value. The first pH in this case is obtained. Then, if the pH of the cleaning solution is the first pH (on a line L2), the convergence time t1 when the space width SP2' of the second resist pattern P2 converges to a constant value is obtained.

Consequently, the space width SP2' (CD2) of the second resist pattern P2 can be the constant value CD0, and non-uniformity in the line widths CD2 may be decreased between wafers W or in a single wafer surface. Further, by varying the pH of the cleaning solution, the convergence time t1 can be further decreased.

By way of example, as an acid cleaning solution having a pH of about 7 or less, it may be possible to use at least one of acids mentioned in the first embodiment as it is or at least one of acids diluted with water or the like.

Fourth Modification Example of First Embodiment

Hereinafter, referring to FIG. 27, there will be explained a substrate processing method in accordance with a fourth modification example of the first embodiment The substrate processing method in accordance with the present modification example is different from the substrate processing method of the first embodiment in that the present modification example includes an acid processing solution process in which a wafer W is processed by an acid processing solution after the first process and before the second process.

Also in the present modification example, the substrate processing system, the developing unit, and the line width measurement apparatus explained in the first embodiment may be used.

However, in the present modification example, the cleaning solution nozzle 6 explained with reference to FIGS. 5A and 5B may be connected with a non-illustrated acid processing solution supply source via a non-illustrated processing solution supply line. Alternatively, a non-illustrated acid processing solution nozzle may be provided separately from the cleaning solution nozzle 6, and the acid processing solution nozzle may be connected with the non-illustrated acid processing solution supply source via the non-illustrated processing solution supply line.

Figure 27:
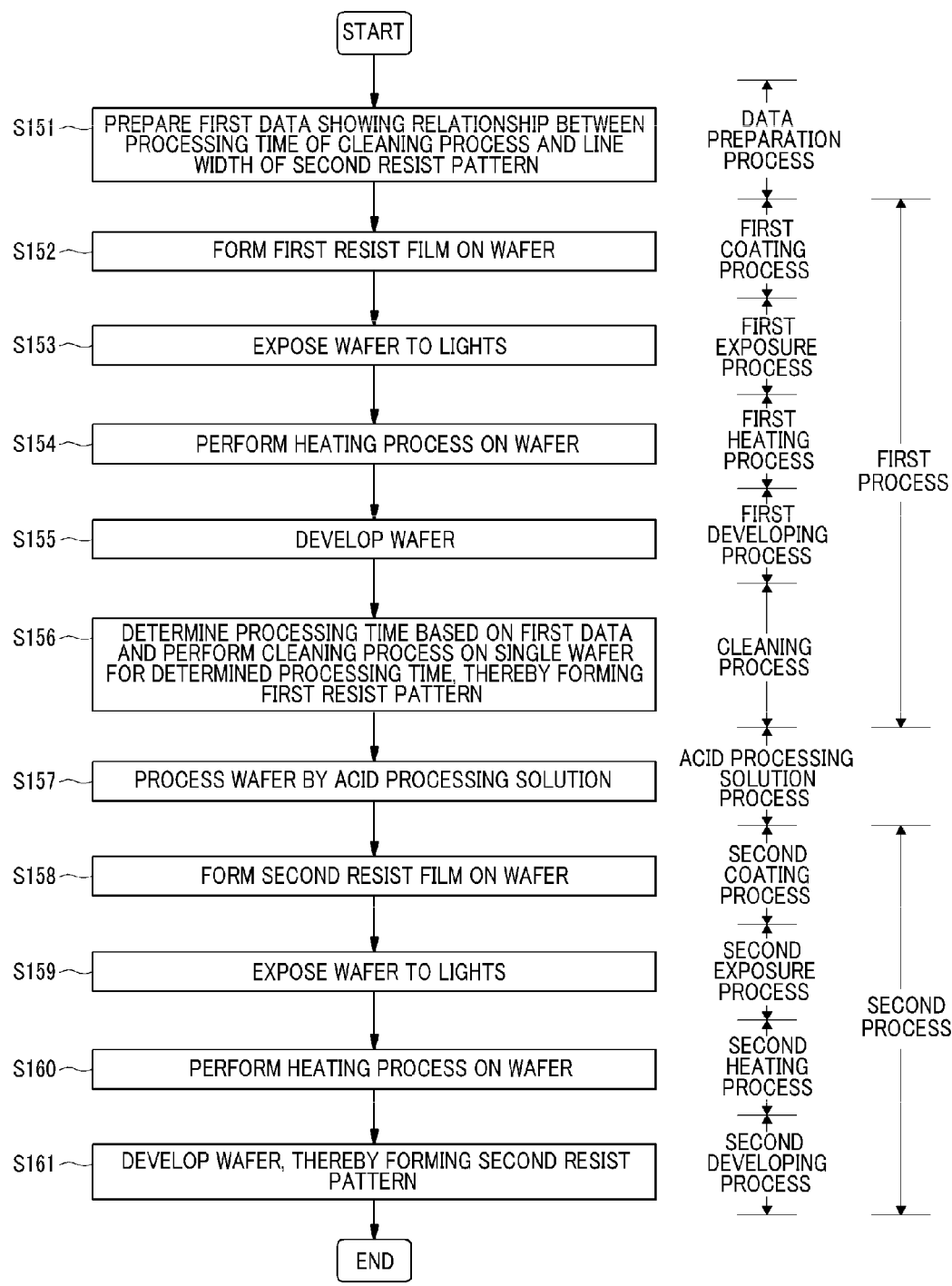
FIG. 27 is a flow chart for explaining a sequence of processes of a substrate processing method in accordance with a fourth modification example of the first embodiment.

FIG. 27 is a flow chart for explaining a sequence of processes of the substrate processing method in accordance with the present modification example.

As depicted in FIG. 27, the substrate processing method in accordance with the present modification example includes a data preparation process (step S151) to a second developing process (step S161). Each of data preparation process (step S151) to a cleaning process (step S156) is the same as each of the data preparation process (step S11) to the cleaning process (step S16) explained with reference to FIG. 9, and, thus, explanation thereof will be omitted. Further, each of a second coating process (step S158) to the second developing process (step S161) is the same as each of the second coating process (step S17) to the second developing process (step S20) explained with reference to FIG. 9, and, thus, explanation thereof will be omitted.

In the present modification example, after the cleaning process (step S156), an acid processing solution process (step S157) is performed before the second coating process (step S158). By way of example, in the acid processing solution process, the wafer W is processed by an acid processing solution having a pH of about 7 or less.

By way of example, as the acid processing solution having the pH of 7 or less, it may be possible to use various kinds of acids mentioned in the first embodiment.

For example, the acid processing solution may be supplied to the wafer W as follows. If the cleaning solution nozzle 6 is connected with the acid processing solution supply source via the processing solution supply line, the acid processing solution may be supplied to the wafer W from the acid processing solution supply source via the cleaning solution nozzle 6, and, thus, the wafer W may be processed by the acid processing solution. Alternatively, if the acid processing solution nozzle provided separately from the cleaning solution nozzle 6 is connected with the acid processing solution supply source via the processing solution supply line, the acid processing solution may be supplied to the wafer W from the acid processing solution supply source via the acid processing solution nozzle, and, thus, the wafer W may be processed by the acid processing solution.

In the acid processing solution process (step S157), the acid processing solution having the pH of 7 or less is used, and, thus, an amount of a developing solution remaining on a surface of the wafer W can be reduced, and a part of the insoluble areas 135*b* is changed into the soluble areas 135*a* in a second heating process (step S160). Consequently, the space width SP2' (CD2) of the second resist pattern P2 can be the constant value CD0 and non-uniformity in the line widths CD2 can be decreased between wafers W or in a single wafer surface. Besides, the convergence time t can be further decreased.

Second Embodiment

Hereinafter, referring to FIGS. 28 to 29E, there will be explained a substrate processing method in accordance with a second embodiment.

The substrate processing method in accordance with the present embodiment is different from the substrate processing method in accordance with the first embodiment in that during a cleaning process, a cleaning solution is supplied to an entire surface of a wafer W and then a drying of the cleaning solution is started at a central area of the wafer W.

Also in the present embodiment, the substrate processing system, the developing unit, and the line width measurement apparatus explained in the first embodiment may be used.

However, in the present embodiment, instead of the cleaning solution nozzle 6 having the slit-shaped discharge opening 62 explained with reference to FIGS. 5A and 5B, a cylindrical cleaning solution nozzle 6*a* may be used. FIGS. 29A to 29E show the state that the cleaning solution is supplied to the wafer W through the cylindrical cleaning solution nozzle 6*a*.

Further, in the present embodiment, the developing unit explained with reference to FIGS. 4, 5A and 5B may not include the gas nozzle.

Figure 28:
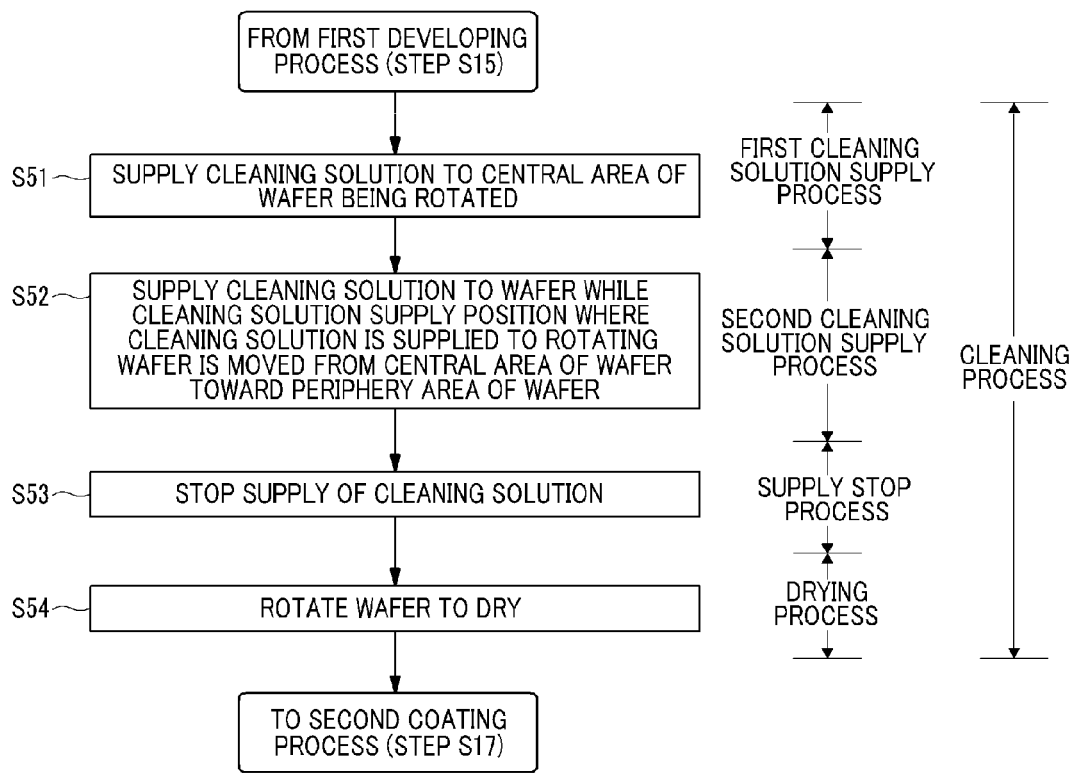
FIG. 28 is a flow chart for explaining a sequence of processes of a cleaning process of a substrate processing method in accordance with a second embodiment.

FIG. 28 is a flow chart for explaining a sequence of processes of a cleaning process of a substrate processing method in accordance with the present embodiment. FIGS. 29A to 29E are perspective views showing a status of a wafer in each process of the cleaning process in the present embodiment.

The substrate processing method in accordance with the present embodiment is the same as the substrate processing method in accordance with the first embodiment except the cleaning process (step S16). Therefore, explanation of other processes (step S11 to step S15 and step S17 to step S20) than the cleaning process will be omitted.

The cleaning process of the substrate processing method in accordance with the present embodiment includes a first cleaning solution supply process (step S51), a second cleaning solution supply process (step S52), a supply stop process (step S53), and a drying process (step S54).

Figure 29A:
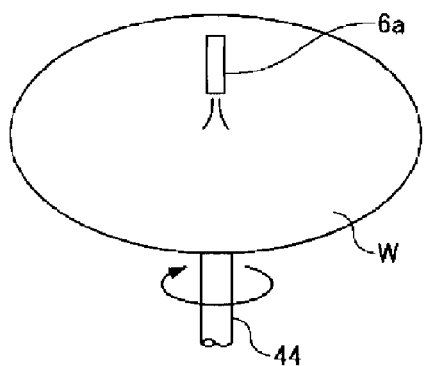
FIGS. 29A to 29E are perspective views showing a status of a wafer in each process of the cleaning process in the second embodiment.

In the cleaning process, first of all, the first cleaning solution supply process (step S51) is performed. In the first cleaning solution supply process (step S51), the developed wafer W is rotated and the cleaning solution is supplied to a central area of the rotated wafer W. FIG. 29A shows a status of the wafer W in the first cleaning solution supply process (step S51).

As depicted in FIG. 29A, the cleaning solution nozzle 6*a* is positioned above the central area of the wafer W, and while the wafer holder 44 is being rotated at a rotational speed of about 1000 rpm, the cleaning solution such as pure water is discharged to the central area of the wafer W from the cleaning solution nozzle 6*a* at a flow rate of, e.g., about 500 ml/min for, e.g., about 5 seconds. Consequently, the cleaning solution spreads from the central area of the wafer W to the periphery are of the wafer W by a centrifugal force and a liquid film is formed on the entire surface of the wafer W.

Figure 29D:
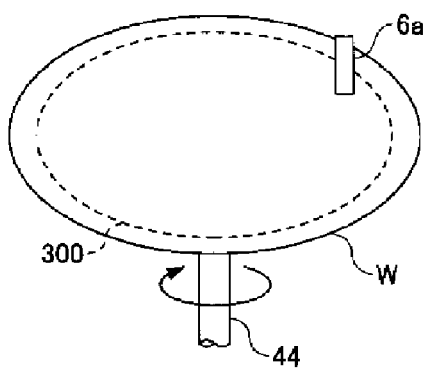
Figure 29B:
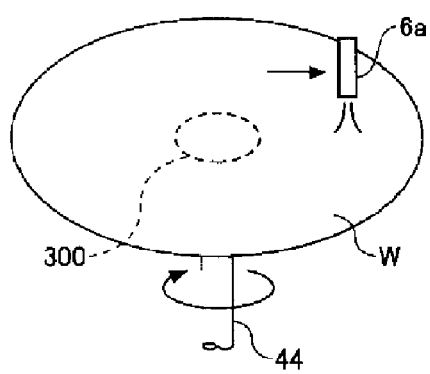

Then, the second cleaning solution supply process (step S52) is performed. In the second cleaning solution supply process (step S52), while a cleaning solution supply position where the cleaning solution is supplied to the rotating wafer W is moving from the central area of the wafer W toward the periphery area of the wafer W, the cleaning solution is supplied to the wafer W. FIG. 29B shows a status of the wafer W in the second cleaning solution supply process (step S52).

As depicted in FIG. 29B, the wafer holder 44 is rotated at a rotational speed of about 1500 rpm or higher, for example, about 2000 rpm. While the wafer holder 44 is being rotated and the cleaning solution is being discharged at a flow rate of, for example, about 250 ml/min, the cleaning solution nozzle 6*a* moves from the central area of the wafer W toward a preset position at a speed of, for example, about 20 mm/sec. In this way, by moving the cleaning solution supply position from the central area of the wafer W to the periphery area of the wafer W, a dried area 300 is formed at the central area of the wafer W. That is, since the cleaning solution which has been supplied to the central area of the wafer W is moved, the liquid film starts to be dried from the central area of the wafer W and the dried area 300 is formed at the central area of the wafer W. Then, the dried area 300 spreads toward the periphery area of the wafer W.

Subsequently, the supply stop process (step S53) is performed. In the supply stop process (step S53), the supply of the cleaning solution is stopped. FIG. 29C shows a status of the wafer in the supply stop process (step S53).

As depicted in FIG. 29C, at a position away from the central area of the wafer W by a preset distance toward the periphery area of the wafer W, the supply of the cleaning solution is stopped. Herein, "preset distance" is, in a range of, for example, from about 50 mm to about 95 mm. That is because if the position (cleaning solution supply position) of the cleaning solution nozzle 6*a* is too far away from the central area of the wafer W when the supply of the cleaning solution is stopped, a centrifugal force applied to the cleaning solution is great and a liquid flow is in disarray, so that foreign substances such as dissolved by-products or particles may remain on the wafer W. On the contrary, if the position (cleaning solution supply position) of the cleaning solution nozzle 6*a* is too close to the central area of the wafer W when the supply of the cleaning solution is stopped, the dried area 300 quickly reaches the periphery of the wafer W and the cleaning solution cannot be sufficiently widely spread toward the periphery area of the wafer W.

A processing time in the present embodiment includes a time for performing the first cleaning solution supply process and a time for performing the second cleaning solution supply process.

Thereafter, the drying process (step S54) is performed. In the drying process (step S54), the wafer W is rotated and dried. FIGS. 29D and 29E show statuses of the wafer in the drying process (step S54).

After the discharge of the cleaning solution from the cleaning solution nozzle 6a is stopped in the supply stop process (step S53), the wafer W is rotated at a rotational speed (i.e., about 2000 rpm in this embodiment). Consequently, as depicted in FIG. 29D, the dried area 300 spreads toward the outside. If the dried area 300 spreads as described above, an interface between an outer circumference of the dried area 300 and an inner circumference of the cleaning solution is pressed outwards and raised upwards due to evaporation of the liquid and foreign substances in an interface between the wafer W and the liquid are upswept and separated from the interface, and, thus, it becomes easy to move the foreign substances to the outside of the wafer W.

Figure 29E:
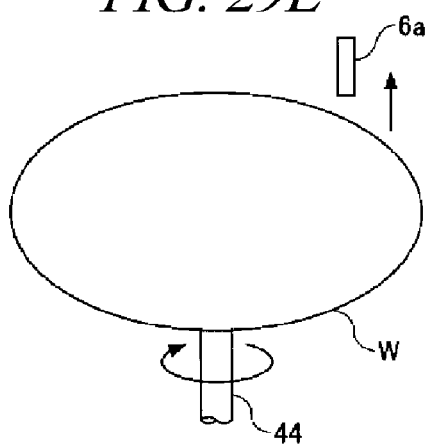
Figure 29C:
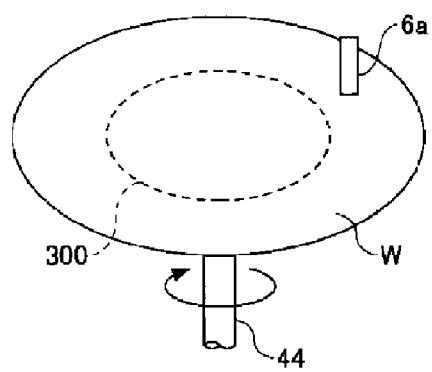

Further, after the dried area 300 spreads to the periphery area of the wafer W, the cleaning solution nozzle 6a may be retreated from the wafer W and liquid on the wafer W may be removed by a centrifugal force caused by the rotation of the wafer W so as to dry the wafer W as depicted in FIG. 29E. In the drying process (step S54), a rotational speed of the wafer may be in a range of from about 2000 rpm to about 2500 rpm.

In the cleaning process, if the cleaning solution is supplied to the wafer W while the cleaning solution supply position where the cleaning solution is supplied to the rotating wafer W is moved from the central area of the wafer W toward the periphery area of the wafer W, a supply amount of the cleaning solution is likely to be decreased at the central area of the wafer W as compared to the periphery area of the wafer W. Therefore, in accordance with the present embodiment, by preparing the first data and determining a processing time of the cleaning process based on the first data, the processing time t may be determined so as to be substantially the same as the convergence time t1 when the line width CD2 of the second resist pattern P2 converges. Thus, non-uniformity in the line widths CD2 of the second resist pattern P2 may be decreased in a single wafer surface without increasing the processing time t.

In the present embodiment, there has been explained a case where a gas nozzle is not included in the developing unit (DEV) 28 explained with reference to FIGS. 3 and 4. However, it is also possible to include the gas nozzle 7 explained with reference to FIGS. 3 and 4 in order to form an initially dried area at the central area of the wafer W. Further, in the second cleaning solution supply process (step S52) or in the supply stop process (step S53), a gas may be supplied to the central area of the wafer W through the gas nozzle 7, and, thus, the initially dried area may be formed at the central area of the wafer W.

Furthermore, in the same manner as the first modification example of the first embodiment, also in the present embodiment, the processing time t may be determined based on a relationship between the processing time t and each of line widths CD2-1 and CD2-2 of the second resist pattern P2 on the central area of the wafer W and the periphery area of the wafer W.

Moreover, in the same manner as the second modification example of the first embodiment, also in the present embodiment, the first processing condition may include other conditions such as a temperature T, a flow rate F, or a pH of the cleaning solution than the processing time t. In this case, the first developing process (step S115) shown in FIG. 19 may be performed instead of the first developing process (step S15) shown in FIG. 28 and the second coating process (step 117) shown in FIG. 19 may be performed instead of the second coating process (step S17) shown in FIG. 28.

In the same manner as the third modification example of the first embodiment, also in the present embodiment, the first data may show a relationship between the processing time t, the second processing condition under which the cleaning process is performed on the wafer W in the first process and the line width CD2 of the second resist pattern P2. The second processing condition may include, for example, the temperature T, the flow rate F, and the pH of the cleaning solution. In this case, the first developing process (step S135) shown in FIG. 23 may be performed instead of the first developing process (step S15) shown in FIG. 28 and the second coating process (step 137) shown in FIG. 23 may be performed instead of the second coating process (step S17) shown in FIG. 28.

In the same manner as the fourth modification example of the first embodiment, also in the present embodiment, an acid processing solution process in which the wafer W is processed by an acid processing solution may be performed after the first process before the second process. In this case, the first developing process (step S155) shown in FIG. 27 may be performed instead of the first developing process (step S15) shown in FIG. 28 and the acid processing solution process (step 157) shown in FIG. 27 may be performed instead of the second coating process (step S17) shown in FIG. 28. Further, as an acid processing solution, it may be possible to use at least one of acids mentioned in the first embodiment as it is or at least one of acids diluted with water or the like.

Modification Example of Second Embodiment

Hereinafter, referring to FIGS. 30A to 31B, there will be explained a substrate processing method in accordance with a modification example of the second embodiment.

The substrate processing method in accordance with the present modification example is different from the substrate processing method of the second embodiment in that a cleaning solution supply position where the cleaning solution is supplied to the wafer W is not moved in a cleaning process.

Also in the present modification example, the substrate processing system, the developing unit, and the line width measurement apparatus explained in the first embodiment may be used in the same manner as the second embodiment.

Figure 30A:
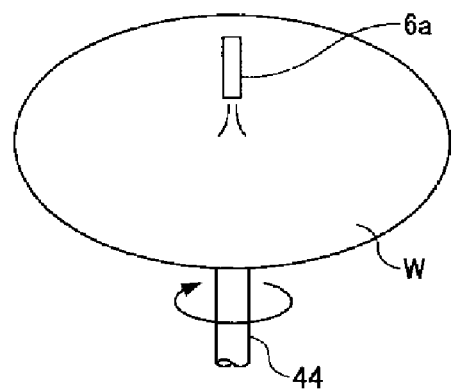
FIGS. 30A to 30C are perspective views showing a status of a wafer in each process of a cleaning process in a modification example of the second embodiment.
Figure 30B:
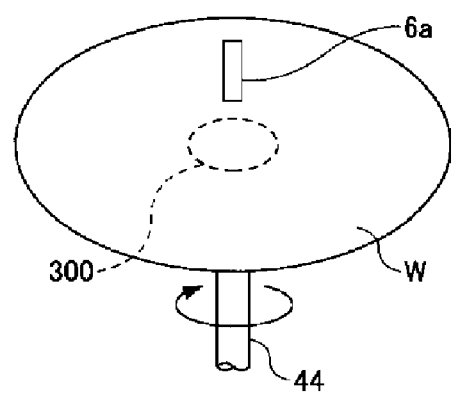
Figure 30C:
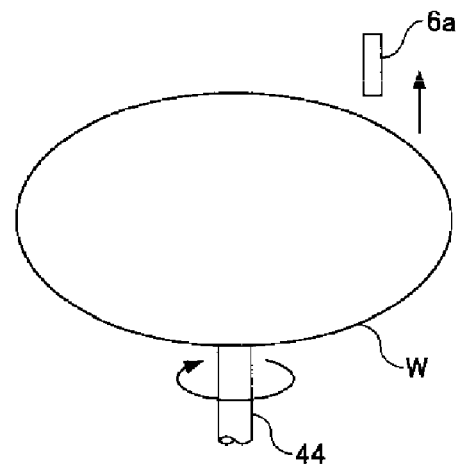

However, in the same manner as the second embodiment, instead of the cleaning solution nozzle 6 having the slit-shaped discharge opening 62 explained with reference to FIGS. 5A and 5B, the cylindrical cleaning solution nozzle 6a may be used. FIGS. 30A to 30C show the state that the cleaning solution is supplied to the wafer W through the cylindrical cleaning solution nozzle 6a.

Further, in the same manner as the second embodiment, also in the present modification example, the developing unit explained with reference to FIGS. 3 and 4 may not include the gas nozzle.

FIGS. 30A to 30C are perspective views showing a status of a wafer in each process of a cleaning process in the present modification example.

The substrate processing method in accordance with the present modification example is the same as the substrate processing method in accordance with the first embodiment except the cleaning process (step S16). Therefore, explanation of other processes (step S11 to step S15 and step S17 to step S20) than the cleaning process will be omitted.

The cleaning process of the substrate processing method in accordance with the present modification example is different from the cleaning process of the substrate processing method in accordance with the second embodiment in that the second cleaning solution supply process (step S52) is omitted. That is, the cleaning process of the substrate processing method in accordance with the present modification example includes the first cleaning solution supply process (step S51), the supply stop process (step S53), and the drying process (step S54) of the second embodiment.

In the same manner as the second embodiment, the first cleaning solution supply process (step S51) is performed. FIG. 30A shows a status of the wafer in the first cleaning solution supply process (step S51).

Then, the supply stop process (step S53) is performed. In the supply stop process (step S53), when the cleaning solution nozzle 6a is positioned above the central area of the wafer W, the supply of the cleaning solution is stopped. FIG. 30B shows a status of the wafer W in the supply stop process (step S53).

As depicted in FIG. 30B, while the cleaning solution nozzle 6a is positioned above the central area of the wafer W, the supply of the cleaning solution from the cleaning solution nozzle 6a is stopped. Further, by stopping the supply of the cleaning solution, the dried area 300 is formed at the central area of the wafer W.

Subsequently, the drying process (step S300) is performed. In the drying process (step S54), the wafer W is rotated and dried. FIG. 30C shows a status of the wafer in the drying process (step S54).

A processing time in the present modification example may include a time for performing the first cleaning solution supply process.

In the same manner as the first embodiment, also in the modification example, by preparing first data in advance, an accurate convergence time t1 can be obtained. Therefore, the processing time t is determined to become substantially the same as the convergence time t1, so that non-uniformity in the line widths CD2 of the second resist pattern P2 in a surface of a single wafer can be decreased without increasing the processing time t.

Hereinafter, by using a comparative example 2 in which the first data has not been prepared in advance, there will be explained a comparison result of distribution of the line widths CD2 of the second resist pattern P2 in a wafer surface.

Figure 31A:
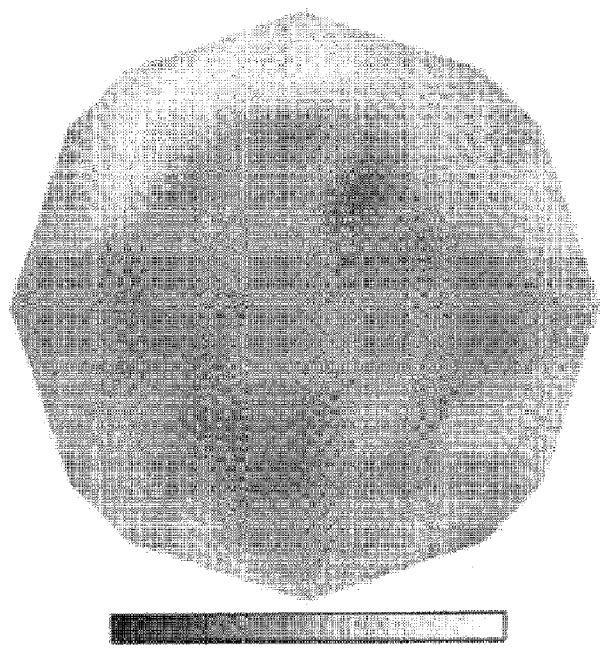
FIGS. 31A and 31B show distribution of space widths of a second resist pattern in a wafer obtained by performing substrate processing methods in accordance with the modification example of the first embodiment and a comparative example 2.
Figure 31B:
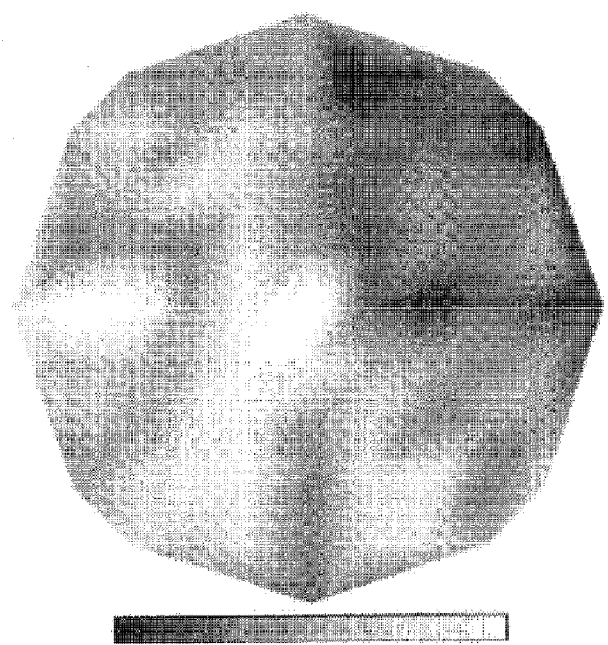

FIGS. 31A and 31B show distribution of space widths of a second resist pattern in a wafer surface obtained by performing the substrate processing methods in accordance with the present modification example and the comparative example 2, respectively. Further, FIGS. 31A and 31B show the distribution of the space widths represented by a gray scale using substantially the same upper and lower limit values.

In the comparative example 2, as depicted in FIG. 31B, substantially the same value is not shown over the entire surface of the wafer W, and, thus, it is deemed that a cleaning process is not performed sufficiently. Meanwhile, in the present modification example, as depicted in FIG. 31A, substantially the same value is shown over the entire surface of the wafer W, and, thus, it is deemed that a cleaning process is performed sufficiently.

Further, non-uniformity CD3σ in the space width SP2' (line width CD2) of the present modification example is smaller than that of the comparative example 2. Therefore, in accordance with the present modification example, non-uniformity in the space width SP2' (line width CD2) in a wafer surface can be decreased.

In the cleaning process, if the cleaning solution is supplied to the central area of the rotating wafer W, a supply amount of the cleaning solution may be different between the central area of the wafer W and the periphery area of the wafer W. Therefore, in accordance with the present modification example, by preparing the first data and determining a processing time of the cleaning process based on the first data, the processing time t may be determined so as to be substantially the same as the convergence time t1 when the line width CD2 of the second resist pattern P2 converges. Thus, non-uniformity in the line widths CD2 of the second resist pattern P2 may be decreased in a single wafer surface without increasing the processing time t.

In the same manner as the first modification example of the first embodiment, also in the present modification example, the processing time t may be determined based on a relationship between the processing time t and each of the line widths CD2-1 and CD2-2 of the second resist pattern P2 on the central area of the wafer W and the periphery area of the wafer W.

Further, in the same manner as the second modification example of the first embodiment, also in the present modification example, the first processing condition may include other conditions such as a temperature T, a flow rate F, or a pH of the cleaning solution than the processing time t.

Furthermore, in the same manner as the third modification example of the first embodiment, also in the present modification example, the first data may show a relationship among the processing time t, the second processing condition under which the cleaning process is performed on the wafer W in the first process and the line width CD2 of the second resist pattern P2. Moreover, the second processing condition may include, for example, the temperature T, flow rate F, and pH of the cleaning solution.

Moreover, in the same manner as the fourth modification example of the first embodiment, also in the present modification example, an acid processing solution process in which a wafer W is processed by an acid processing solution may be performed after the first process before the second process. As the acid cleaning solution, it may be possible to use at least one of acids mentioned in the first embodiment as it is or at least one of acids diluted with water or the like.

The embodiments of the present invention have been described above, but the present invention is not limited to the above-described embodiments and can be changed or modified in various ways within a scope of the subject matter of the present invention recited in the following claims.

From the first embodiment to the modification example of the second embodiment, there has been explained a case where a gas supply position is moved from a central area of a wafer toward a periphery area of the wafer while a cleaning solution supply position is moved from the central area of the wafer to the periphery area of the wafer or a case where the cleaning solution supply position is not moved from the central area of the wafer. In other various cleaning processes, first data may be prepared and a processing time of the cleaning process may be determined based on the first data.

Further, the present disclosure may be applied to an apparatus in which a process is performed on a semiconductor substrate, a glass substrate, or other various substrates.

What is claimed is:

1. A substrate processing method for processing a substrate, the method comprising:

a first process of forming a first resist pattern by exposing the substrate having thereon a first resist film to lights, developing the exposed substrate and cleaning the developed substrate; and a second process of forming a second resist pattern by forming a second resist film on the substrate having thereon the first resist pattern, exposing the substrate having thereon the second resist film to lights, and developing the exposed substrate, wherein, a first processing condition is determined based on first data showing a relationship between a first processing condition under which a cleaning process is performed on the substrate in the first process and a line width of the second resist pattern, the first process is performed on the substrate under the determined first processing condition, the first processing condition includes a processing time for performing the cleaning process on the substrate, the first data include a convergence time when line widths of the second resist pattern converge to a constant value, and the processing time is determined so as to be substantially the same as the convergence time based on the first data.

2. The substrate processing method of claim 1,
wherein the first processing condition includes a temperature of a cleaning solution for cleaning the substrate.

3. The substrate processing method of claim 1,
wherein the first processing condition includes a flow rate of a cleaning solution for cleaning the substrate.

4. The substrate processing method of claim 1,
wherein the first processing condition includes a pH of a cleaning solution for cleaning the substrate.

5. The substrate processing method of claim 1, further comprising:
a data preparation process of preparing the first data by performing the first process on each substrate of a substrate set including multiple substrates while varying the first processing condition, performing the second process on each substrate on which the first process has been performed, and measuring the line width of the second resist pattern formed on each substrate.

6. The substrate processing method of claim 1,
wherein the first data show a relationship between the first processing condition and the line width of the second resist pattern formed on a central area of the substrate, and
the first processing condition is determined in order to allow a line width of the second resist pattern formed on the central area of the substrate to be substantially the same as a line width of the second resist formed on a peripheral area of the substrate based on the first data and second data showing a relationship between the first processing condition and the line width of the second resist pattern formed on the peripheral area of the substrate.

7. The substrate processing method of claim 6, further comprising:
a data preparation process of preparing the first data by performing the first process on each substrate of a substrate set including multiple substrates while varying the first processing condition, performing the second process on each substrate on which the first process has been performed, and measuring the line width of the second resist pattern formed on the central area of each substrate, and of preparing the second data by measuring the line width of the second resist pattern formed on the peripheral area of each substrate.

8. The substrate processing method of claim 1,
wherein the first data show a relationship between the processing time, second processing condition under which the cleaning process is performed on the substrate in the first process, and the line width of the second resist pattern,
the processing time and the second processing condition are determined based on the first data, and
the first process is performed on a single substrate under the determined second condition for the determined processing time.

9. The substrate processing method of claim 8,
wherein the second processing condition includes a temperature of a cleaning solution for cleaning the substrate.

10. The substrate processing method of claim 8,
wherein the second processing condition includes a flow rate of a cleaning solution for cleaning the substrate.

11. The substrate processing method of claim 8,
wherein the second processing condition includes a pH of a cleaning solution for cleaning the substrate.

12. The substrate processing method of claim 8, further comprising:
a data preparation process of preparing the first data by performing the first process on each substrate of a substrate set including multiple substrates while varying the processing time or the second processing condition, performing the second process on each substrate on which the first process has been performed, and measuring the line width of the second resist pattern formed on each substrate.

13. The substrate processing method of claim 8,
wherein the first data show a relationship between the processing time, the second processing condition, and the line width of the second resist pattern formed on a central area of the substrate, and
the processing time and the second processing condition are determined in order to allow a line width of the second resist pattern formed on the central area of the substrate to be substantially the same as a line width of the second resist formed on a peripheral area of the substrate based on the first data and second data showing a relationship between the processing time, the second processing condition, and the line width of the second resist pattern formed on the peripheral area of the substrate.

14. The substrate processing method of claim 13, further comprising:
a data preparation process of preparing the first data by performing the first process on each substrate of a substrate set including multiple substrates while varying the processing time or the second processing condition, performing the second process on each substrate on which the first process has been performed, and measuring the line width of the second resist pattern formed on the central area of each substrate, and of preparing the second data by measuring the line width of the second resist pattern formed on the peripheral area of each substrate.

15. The substrate processing method of claim 1,
wherein the first process includes:
while the developed substrate is being rotated, a first cleaning solution supply process of supplying a cleaning solution to a central area of the rotating substrate,
further wherein the processing time includes a time for performing the first cleaning solution supply process.

16. The substrate processing method of claim 15,
wherein the first process further includes:
after the first cleaning solution supply process, a second cleaning solution supply process of supplying the cleaning solution to the substrate while the cleaning solution supply position is moved from the central area of the substrate toward the peripheral area of the substrate, further wherein the processing time includes a time for performing the second cleaning solution supply process.

17. The substrate processing method of claim 1, further comprising:

after the first process and before the second process, an acid processing solution process of processing the substrate by an acid processing solution.

18. A substrate processing method for processing a substrate, the method comprising:

a first process of forming a first resist pattern by exposing the substrate having thereon a first resist film to lights, developing the exposed substrate and cleaning the developed substrate; and a second process of forming a second resist pattern by forming a second resist film on the substrate having thereon the first resist pattern, exposing the substrate having thereon the second resist film to lights, and developing the exposed substrate, wherein, a first processing condition is determined based on first data showing a relationship between a first processing condition under which a cleaning process is performed on the substrate in the first process and a line width of the second resist pattern, the first process is performed on the substrate under the determined first processing condition, and the first processing condition includes a processing time for performing the cleaning process on the substrate, wherein the first process includes:

a cleaning solution supply process of supplying a cleaning solution to the substrate while the developed substrate is being rotated and a cleaning solution supply position where the cleaning solution is supplied to the rotating substrate is moved from a central area of the substrate toward a peripheral area of the substrate; and a gas supply process of supplying a gas toward the periphery area of the substrate at a downstream position of the cleaning solution supply position in a rotation direction of the substrate, further wherein the processing time includes a time for performing the cleaning solution supply process.

* * * * *

UNITED STATES PATENT AND TRADEMARK OFFICE
CERTIFICATE OF CORRECTION

PATENT NO. : 8,367,308 B2
APPLICATION NO. : 13/023670
DATED : February 5, 2013
INVENTOR(S) : Hiroshi Nakamura et al.

It is certified that error appears in the above-identified patent and that said Letters Patent is hereby corrected as shown below:

In the Specifications

Column 6, line 7, add -- 5 -- after "nozzle"

Column 8, line 7, add -- 10 -- after "controller"

Signed and Sealed this
Sixteenth Day of July, 2013

Teresa Stanek Rea
*Acting Director of the United States Patent and Trademark Office*